(12) United States Patent
Jeong et al.

(10) Patent No.: US 9,972,717 B2
(45) Date of Patent: May 15, 2018

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Yeong-Jong Jeong, Yongin-si (KR); Jeong-Yun Lee, Yongin-si (KR); Geo-Myung Shin, Seoul (KR); Dong-Suk Shin, Yongin-si (KR); Si-Hyung Lee, Suwon-si (KR); Seo-Jin Jeong, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/228,421

(22) Filed: Aug. 4, 2016

(65) Prior Publication Data

US 2016/0343859 A1 Nov. 24, 2016

Related U.S. Application Data

(62) Division of application No. 14/600,142, filed on Jan. 20, 2015, now Pat. No. 9,431,478.

(30) Foreign Application Priority Data

Apr. 30, 2014 (KR) .......................... 10-2014-0052532

(51) Int. Cl.
*H01L 27/088* (2006.01)
*H01L 29/78* (2006.01)
(Continued)

(52) U.S. Cl.
CPC .......... *H01L 29/7848* (2013.01); *B82Y 10/00* (2013.01); *H01L 21/823814* (2013.01);
(Continued)

(58) Field of Classification Search
CPC ...... H01L 29/7853–29/7854; H01L 29/41791; H01L 27/1211; H01L 21/823807; H01L 21/823814; H01L 21/823821
See application file for complete search history.

(56) References Cited

U.S. PATENT DOCUMENTS 7,026,199 B2 4/2006 Lee
7,056,781 B2 6/2006 Yoon et al.
(Continued)

FOREIGN PATENT DOCUMENTS

JP 2012-190896 A 10/2012
JP 2013-162076 A 8/2013

*Primary Examiner* — Sonya D McCall Shepard
(74) *Attorney, Agent, or Firm* — Harness, Dickey & Pierce, P.L.C.

(57) ABSTRACT

A semiconductor device and a method of fabricating the same are provided. The semiconductor device comprises a first multi-channel active pattern which is defined by a field insulating layer, extends along a first direction, and includes a first portion and a second portion; a gate electrode which extends along a second direction different from the first direction and is formed on the first portion; and a first source/drain region which is formed around the second portion protruding further upward than a top surface of the field insulating layer and contacts the field insulating layer, wherein the second portion is disposed on both sides of the first portion in the first direction and is more recessed than the first portion, a top surface of the first portion and a top surface of the second portion protrude further upward than the top surface of the field insulating layer, and a profile of sidewalls of the second portion is continuous.

9 Claims, 39 Drawing Sheets

(51) Int. Cl.
  *H01L 29/06* (2006.01)
  *B82Y 10/00* (2011.01)
  *H01L 29/775* (2006.01)
  *H01L 29/41* (2006.01)
  *H01L 21/8238* (2006.01)
  *H01L 27/092* (2006.01)
  *H01L 29/08* (2006.01)
  *H01L 29/16* (2006.01)
  *H01L 29/161* (2006.01)
  *H01L 29/165* (2006.01)
  *H01L 29/423* (2006.01)
  *H01L 29/786* (2006.01)

(52) U.S. Cl.
  CPC .......... *H01L 21/823821* (2013.01); *H01L 21/823878* (2013.01); *H01L 27/0886* (2013.01); *H01L 27/0924* (2013.01); *H01L 29/06* (2013.01); *H01L 29/0653* (2013.01); *H01L 29/0673* (2013.01); *H01L 29/0847* (2013.01); *H01L 29/161* (2013.01); *H01L 29/165* (2013.01); *H01L 29/1608* (2013.01); *H01L 29/413* (2013.01); *H01L 29/42392* (2013.01); *H01L 29/775* (2013.01); *H01L 29/78* (2013.01); *H01L 29/7851* (2013.01); *H01L 29/7853* (2013.01); *H01L 29/78696* (2013.01)

(56) References Cited

U.S. PATENT DOCUMENTS

| | | |
|---|---|---|
| 7,402,856 B2 | 7/2008 | Brask et al. |
| 7,767,560 B2 | 8/2010 | Jin et al. |
| 7,821,044 B2 | 10/2010 | Bohr et al. |
| 7,863,683 B2 | 1/2011 | Kim et al. |
| 8,373,226 B2 | 2/2013 | Taketani |
| 2009/0057846 A1 | 3/2009 | Doyle et al. |
| 2012/0138886 A1 | 6/2012 | Kuhn et al. |
| 2013/0020642 A1 | 1/2013 | Basker et al. |
| 2013/0049080 A1 | 2/2013 | Okano |
| 2013/0082310 A1 | 4/2013 | Yin et al. |
| 2013/0154029 A1 | 6/2013 | Cai et al. |
| 2013/0175620 A1 | 7/2013 | Cai et al. |
| 2013/0193446 A1 | 8/2013 | Chao et al. |
| 2013/0228865 A1 | 9/2013 | Lin et al. |
| 2015/0200291 A1 | 7/2015 | Alptekin et al. |

[Fig 1]
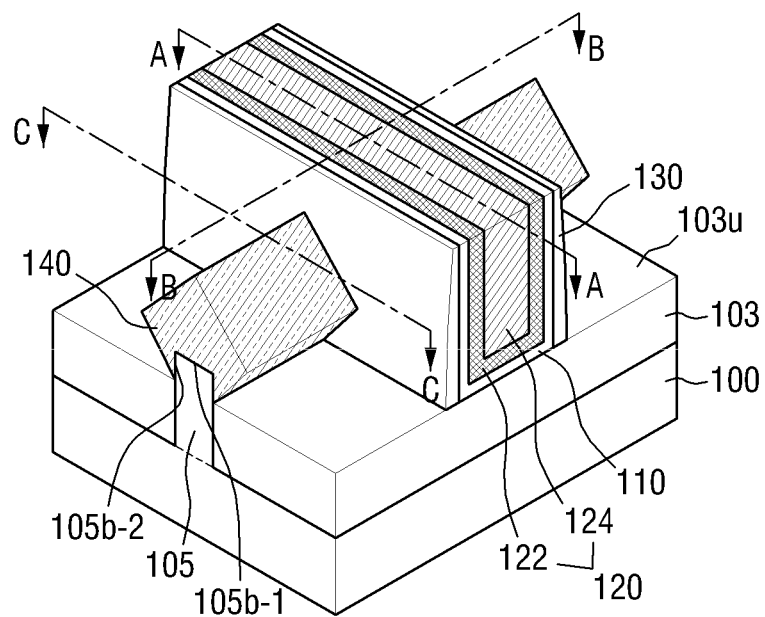

[Fig 2]
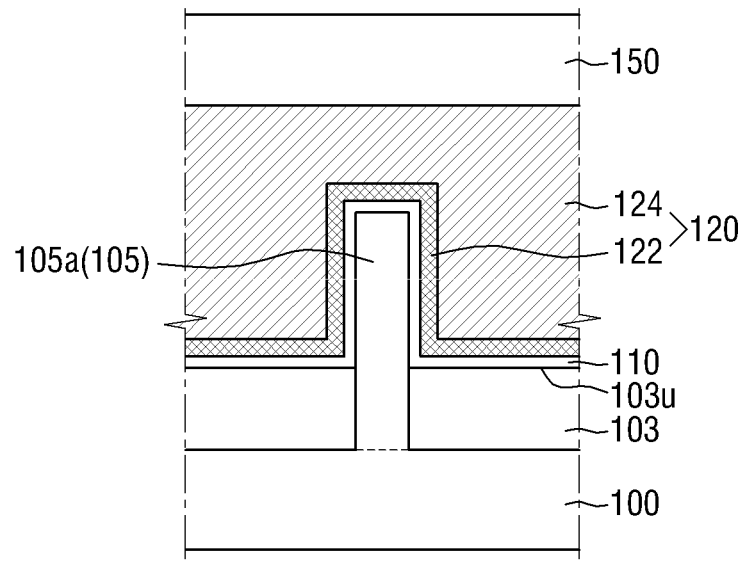
[Fig 3]
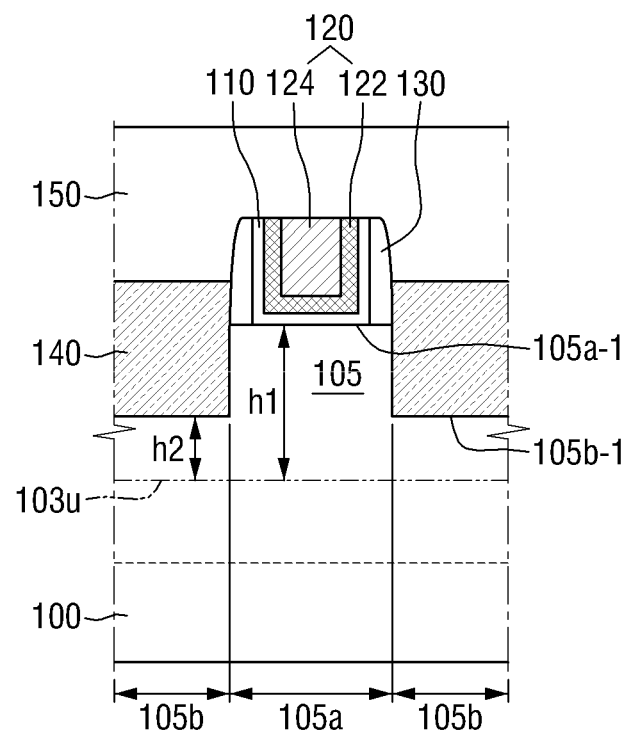

【Fig 4】
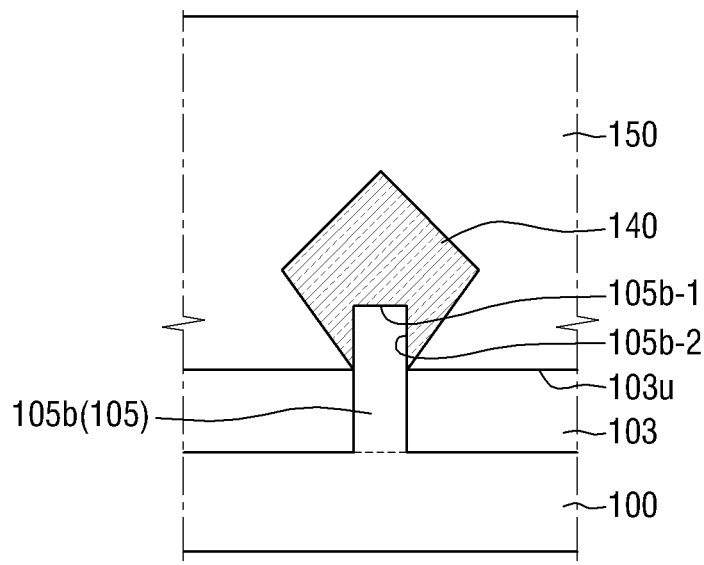
【Fig 5】
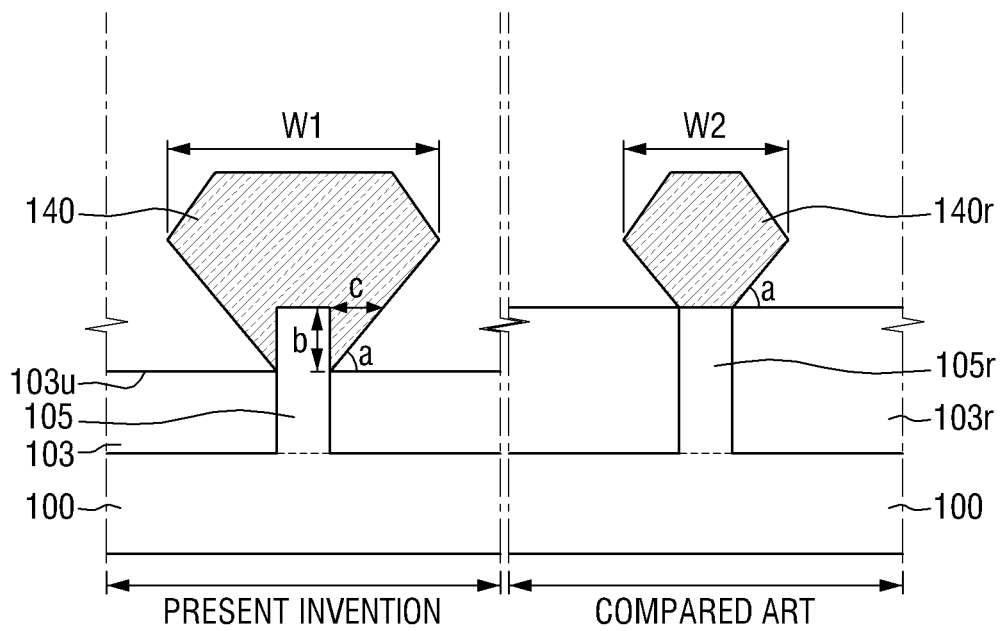
PRESENT INVENTION    COMPARED ART

[Fig 6]
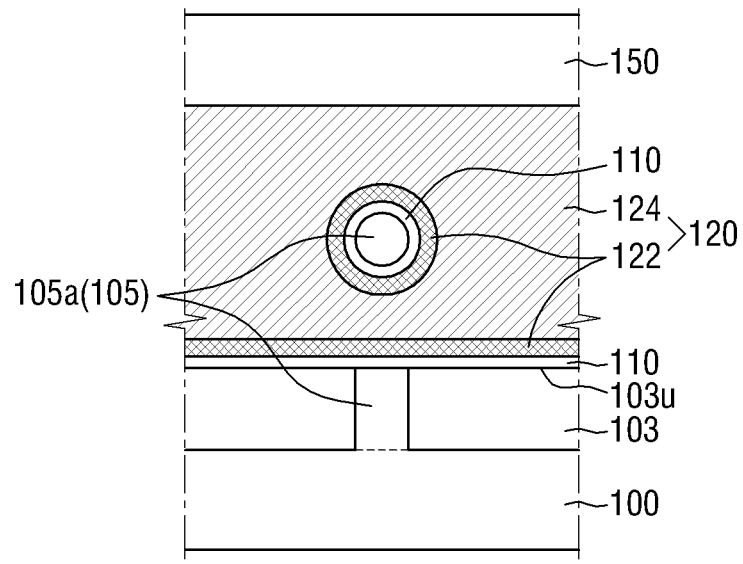
[Fig 7a]
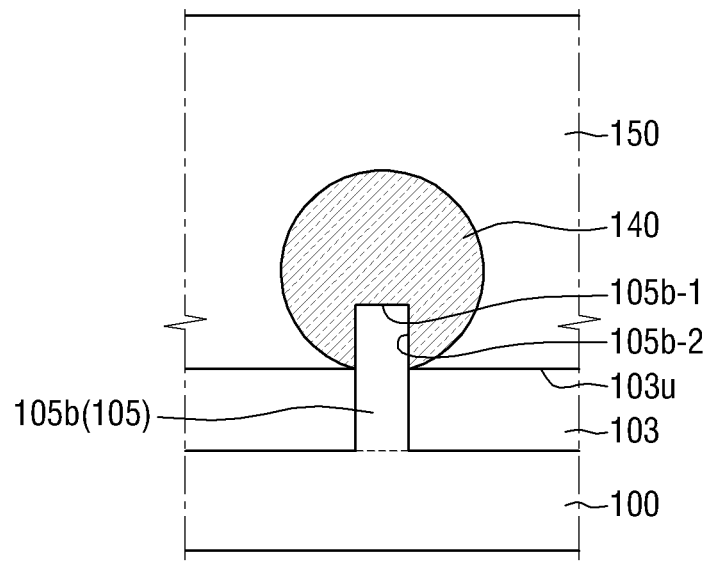

【Fig 7b】
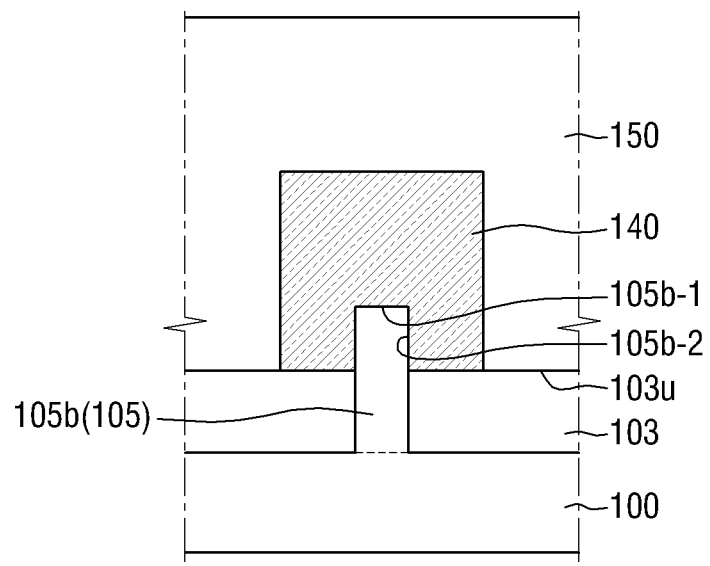

[Fig 8]
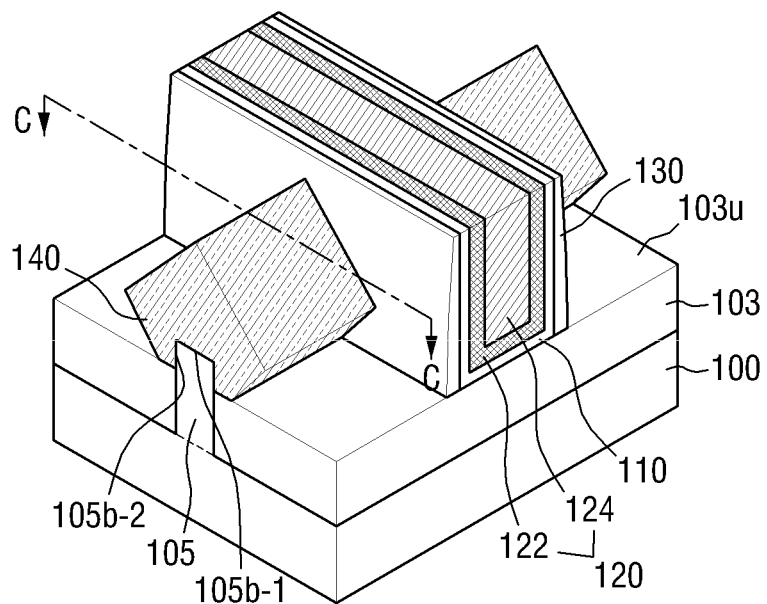

[Fig 9]
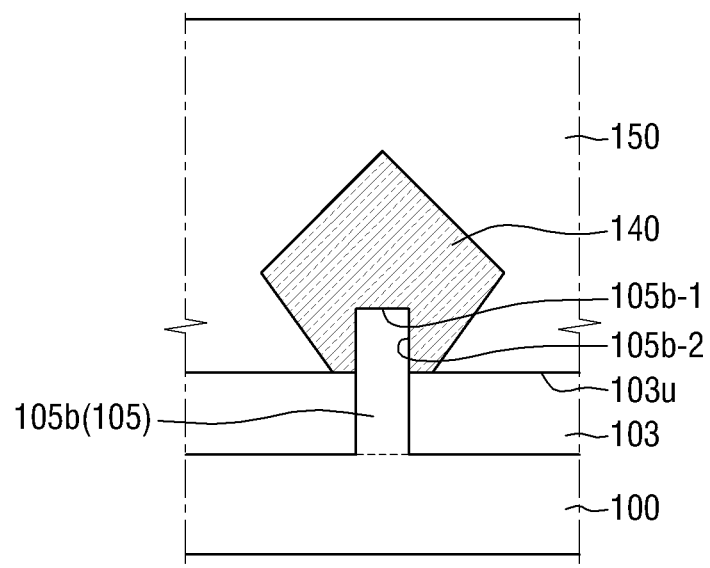

[Fig 10]
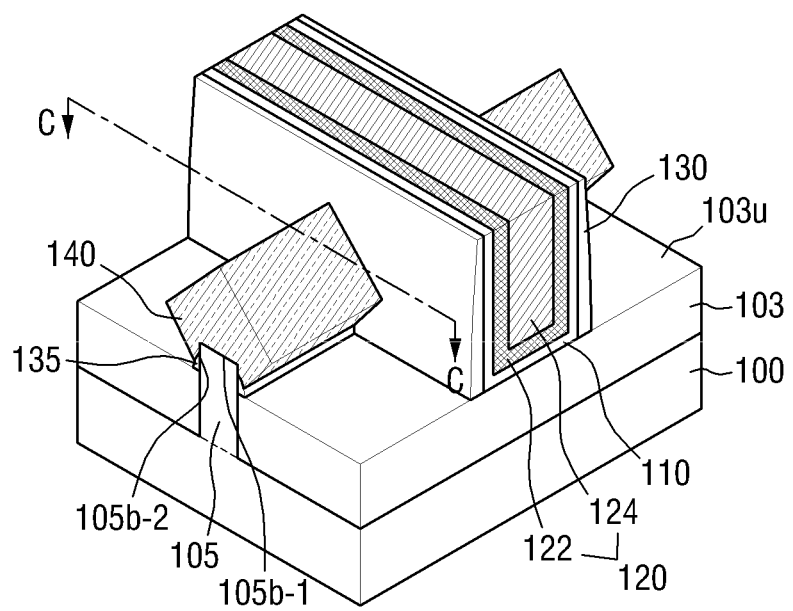

[Fig 11]
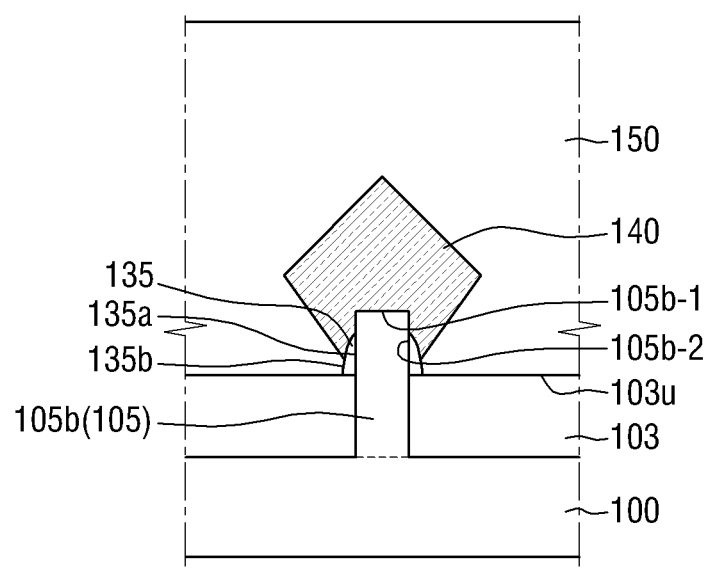

[Fig 12]
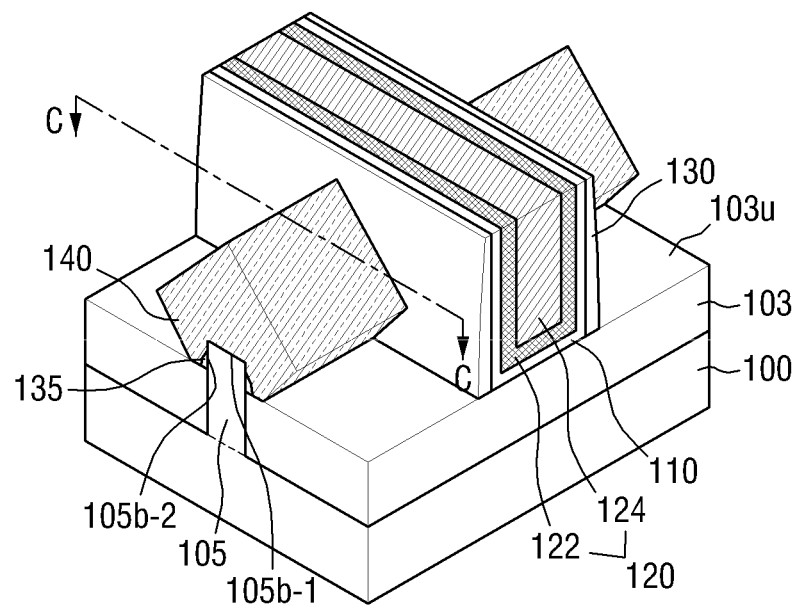

[Fig 13]
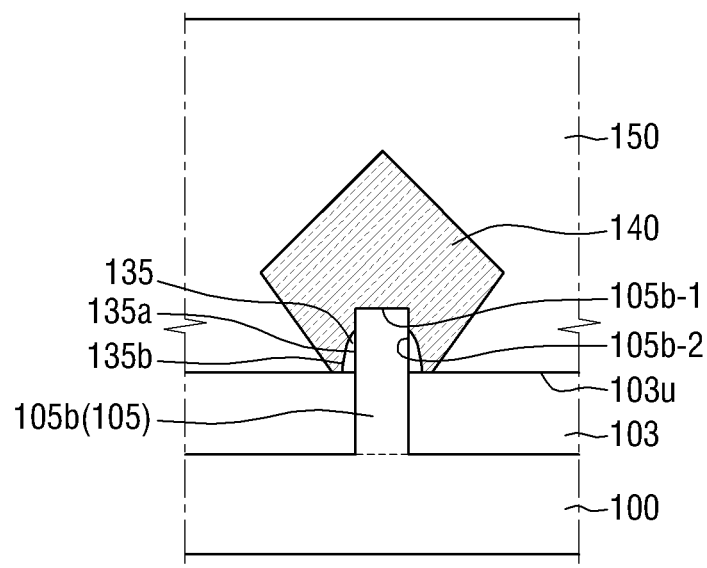

[Fig 14]
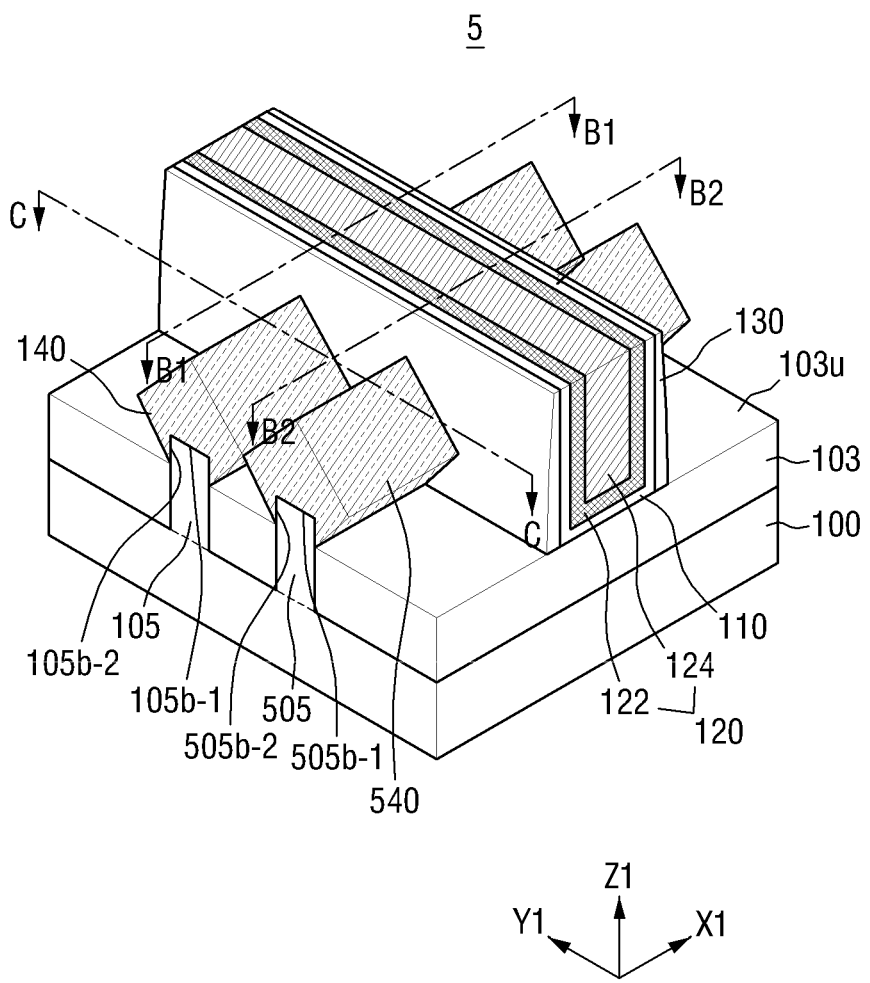

[Fig 15]
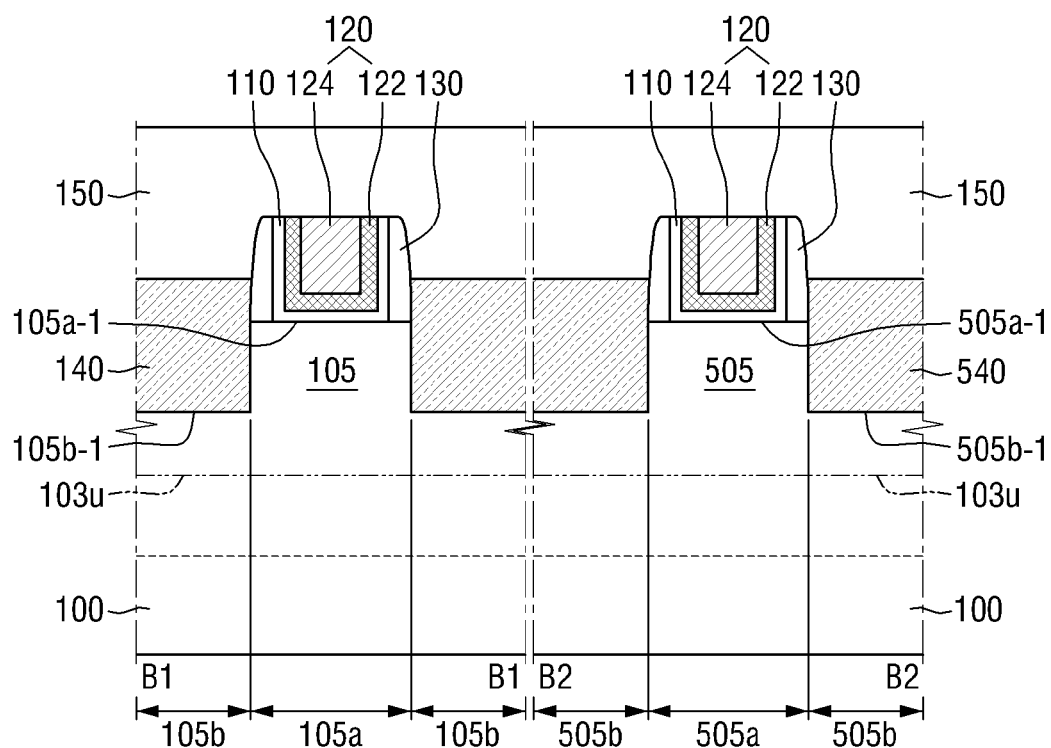
[Fig 16]
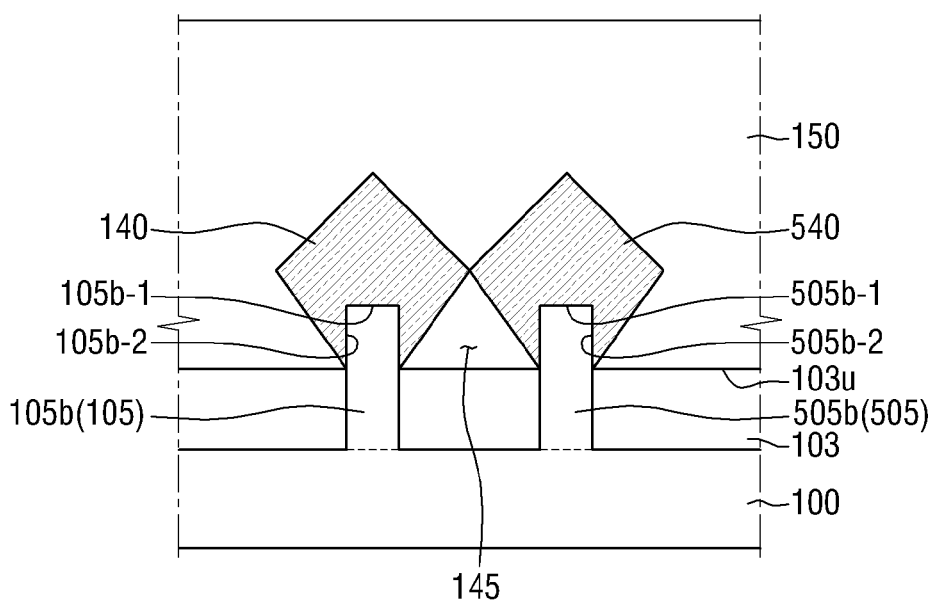

[Fig 17]
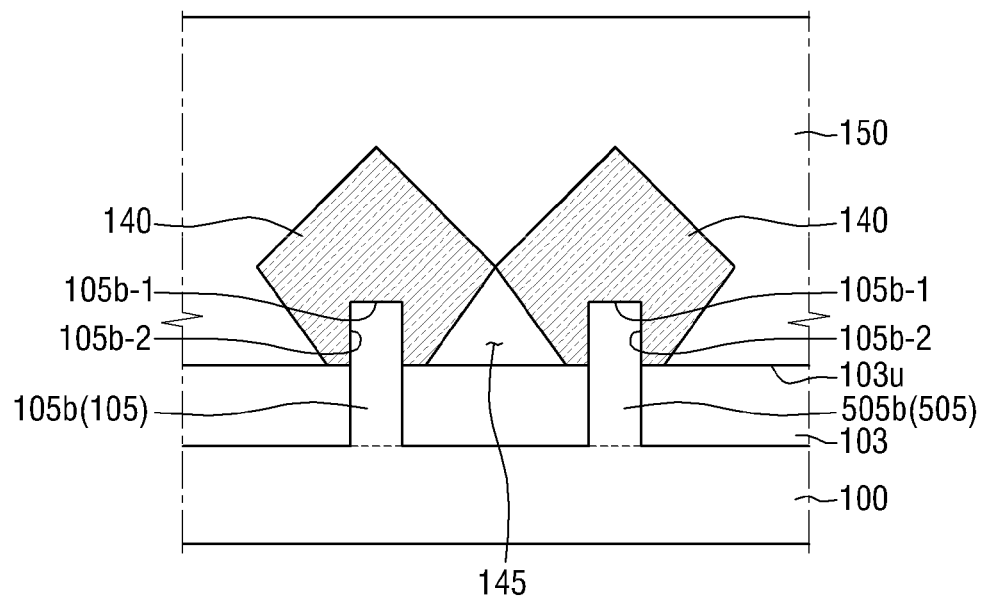
[Fig 18]
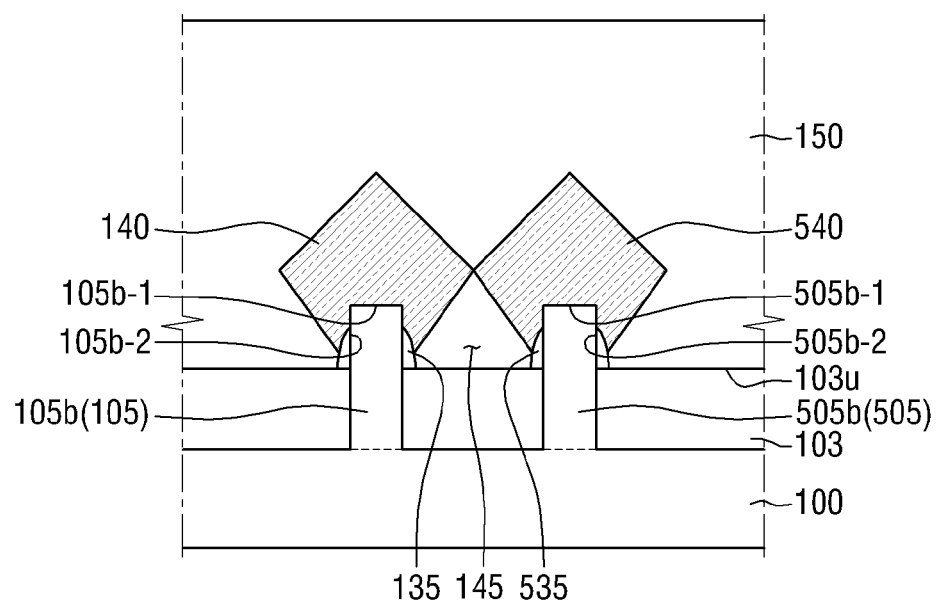

[Fig 19]
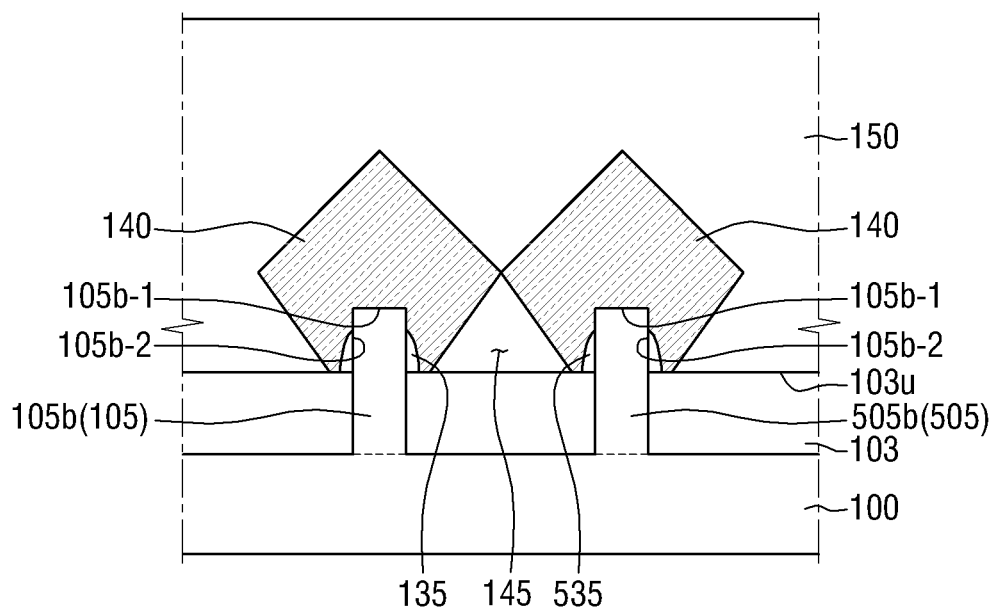

[Fig 20]
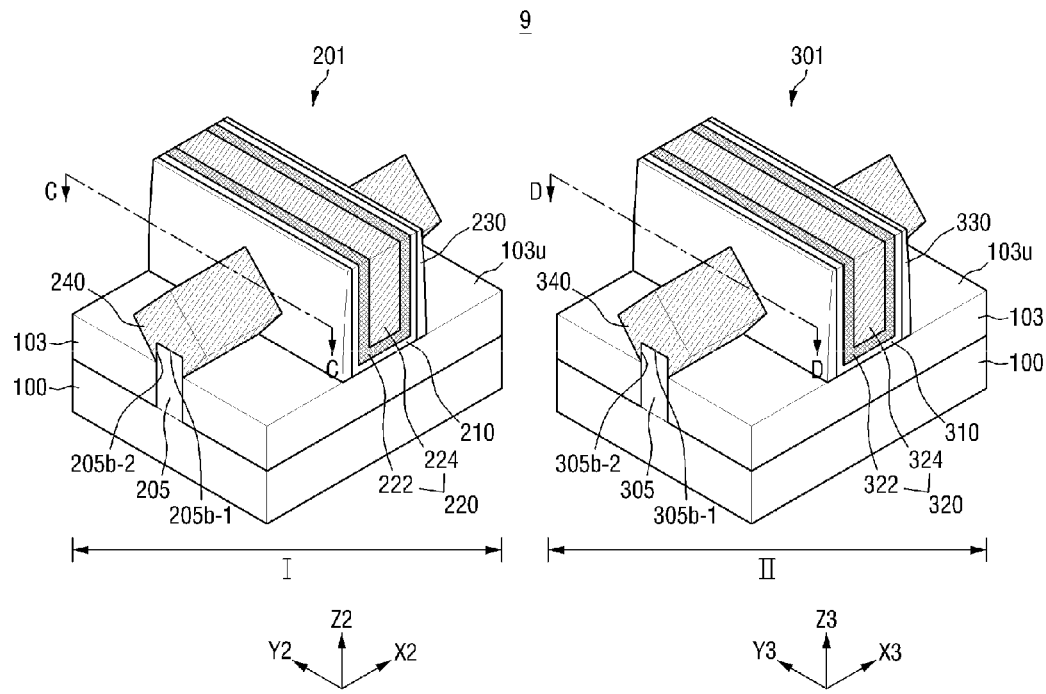
[Fig 21]
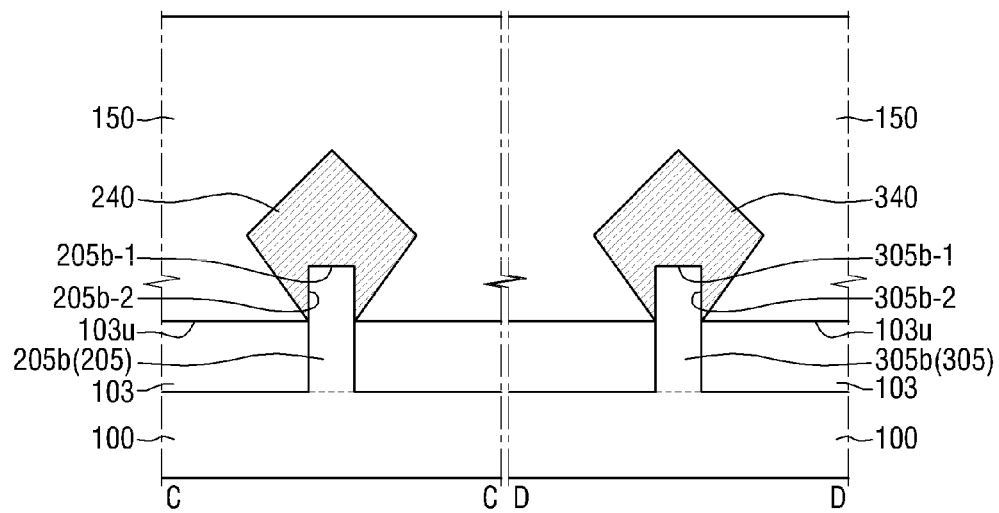

[Fig 22]
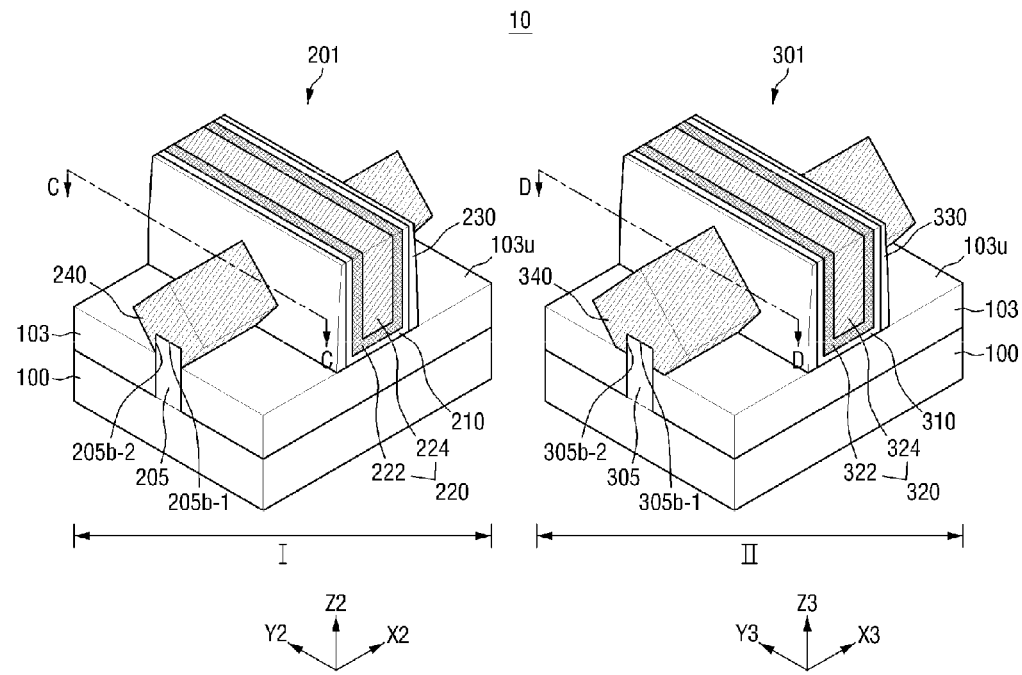
[Fig 23]
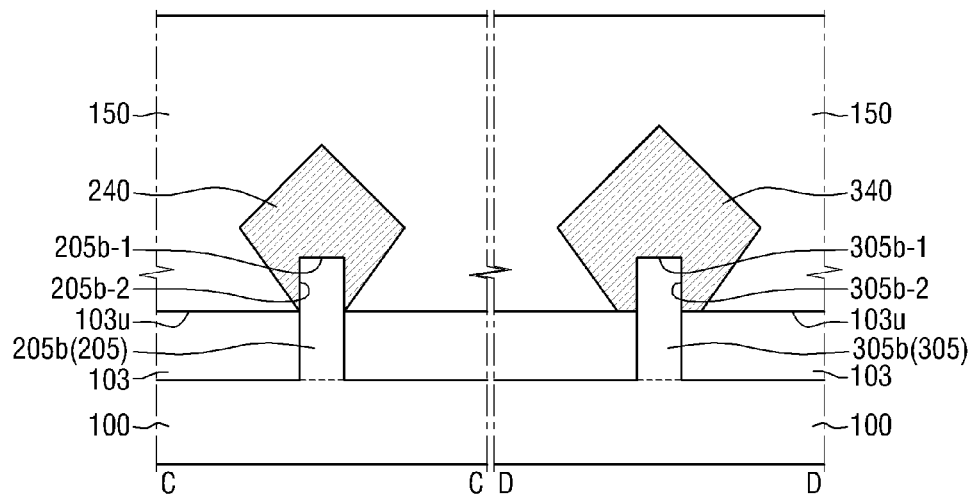

[Fig 24]
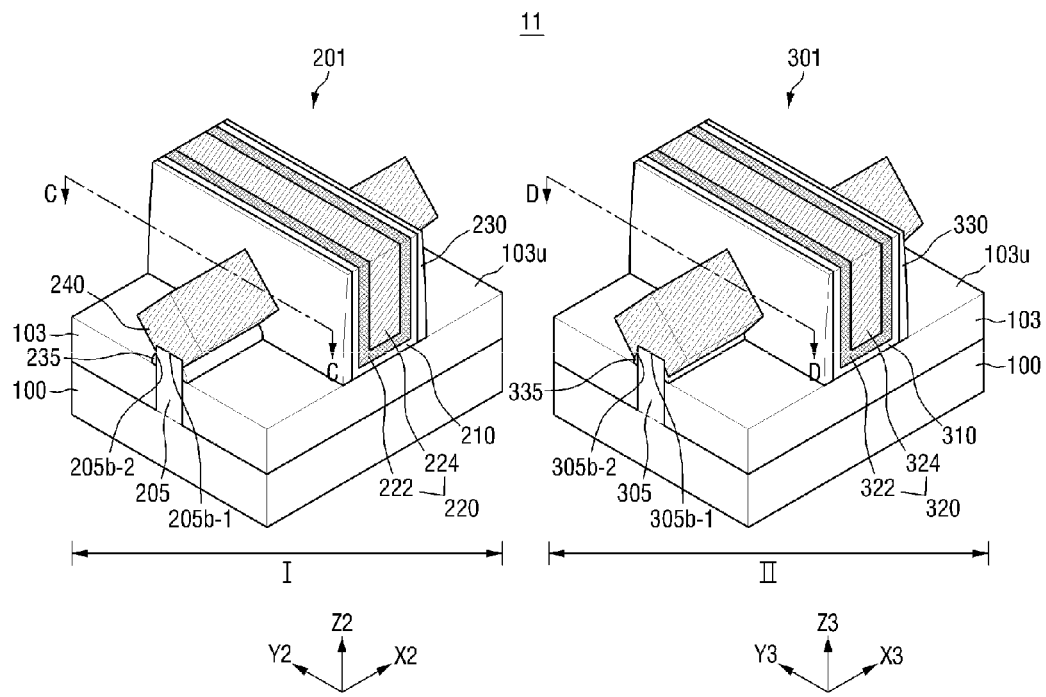
[Fig 25]
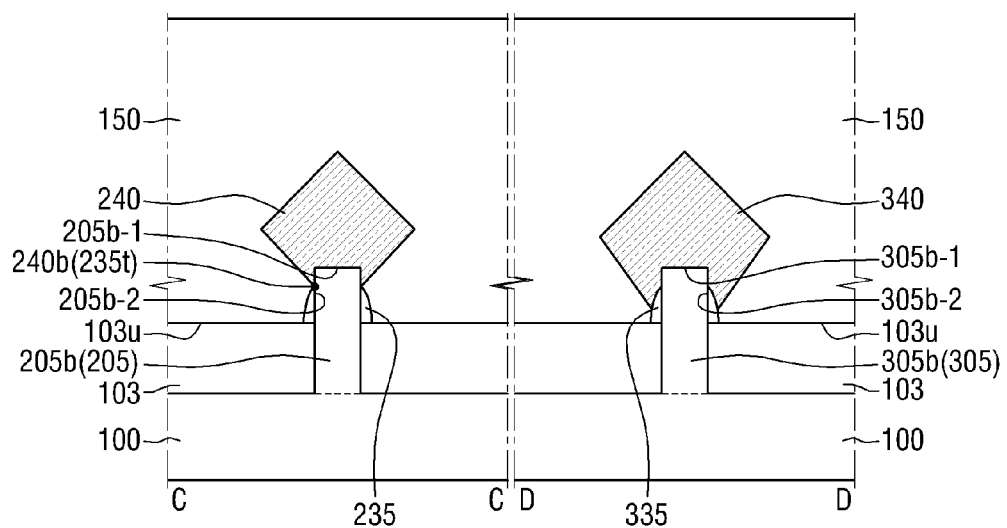

[Fig 26]
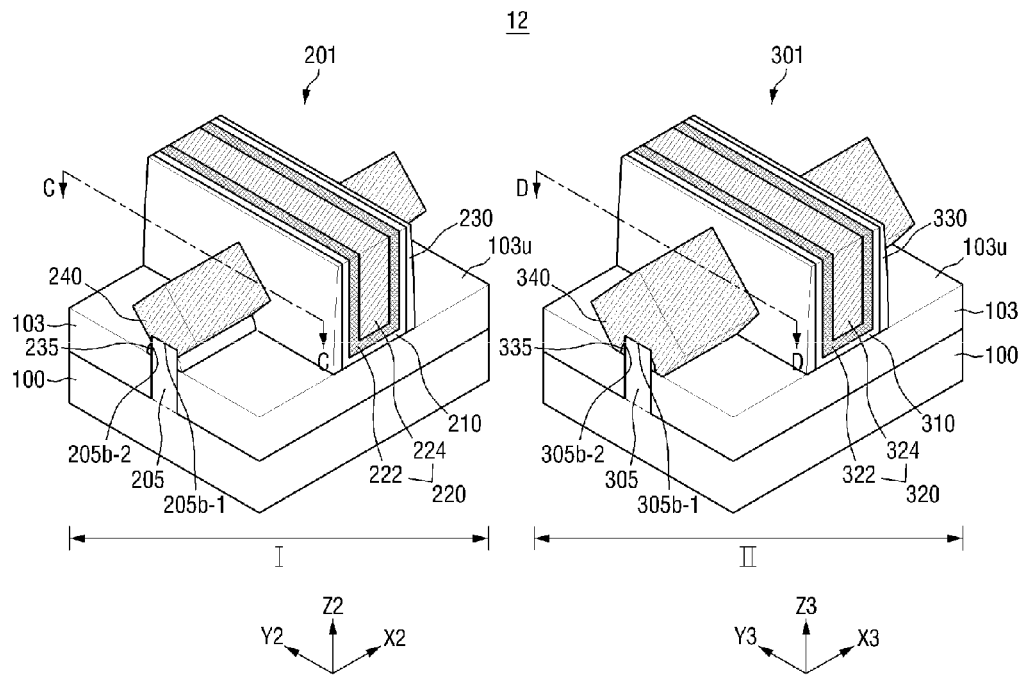
[Fig 27]
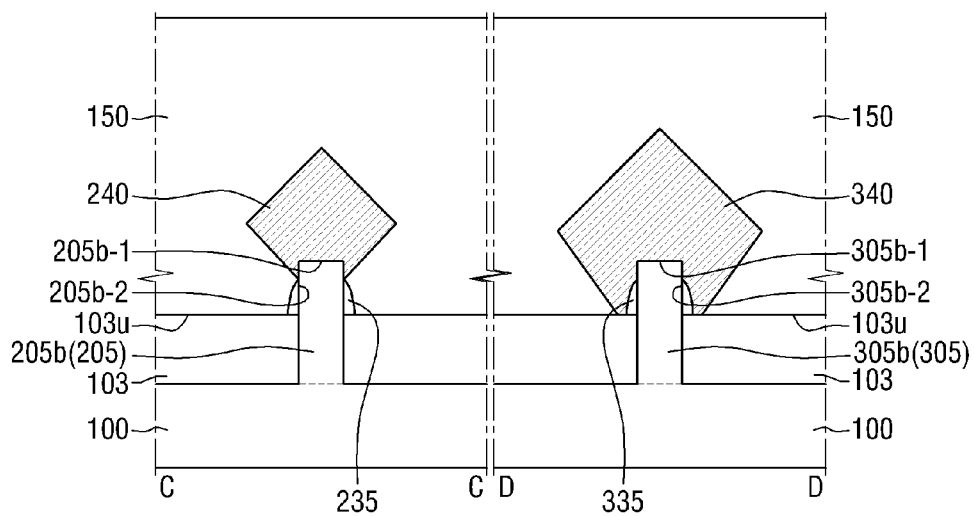

[Fig 28]
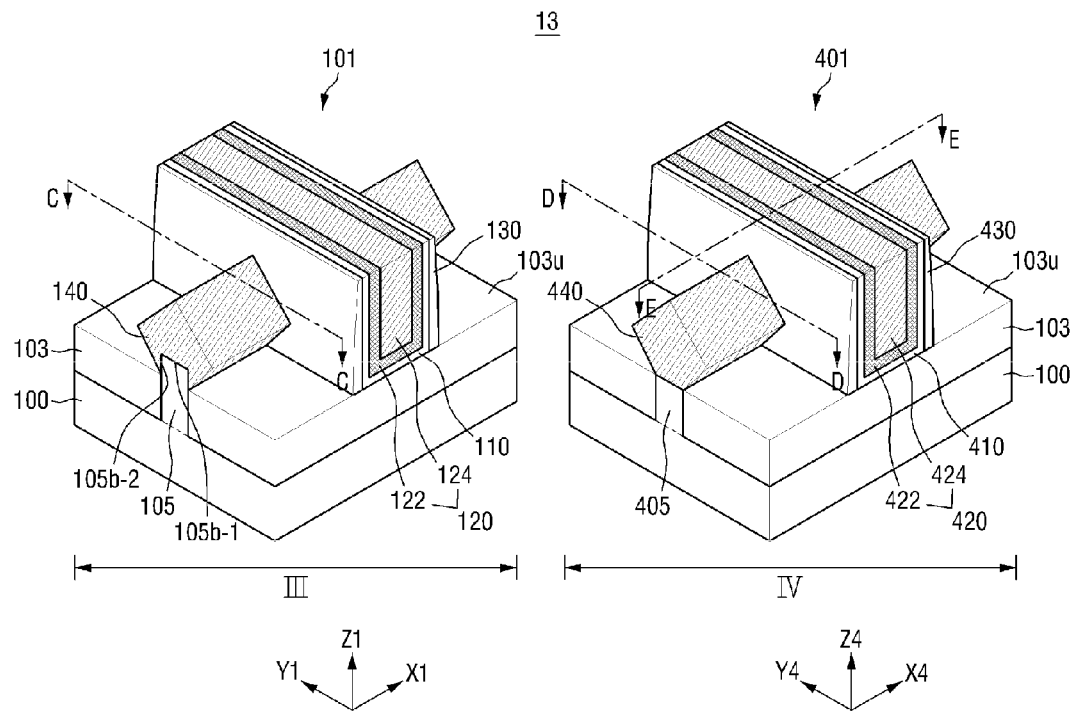
[Fig 29]
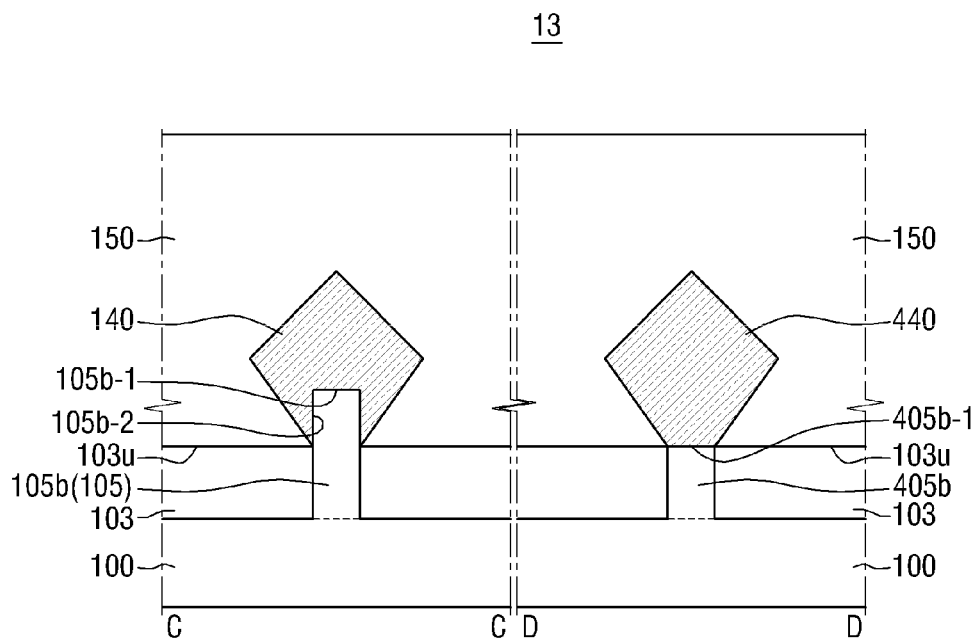

[Fig 30]
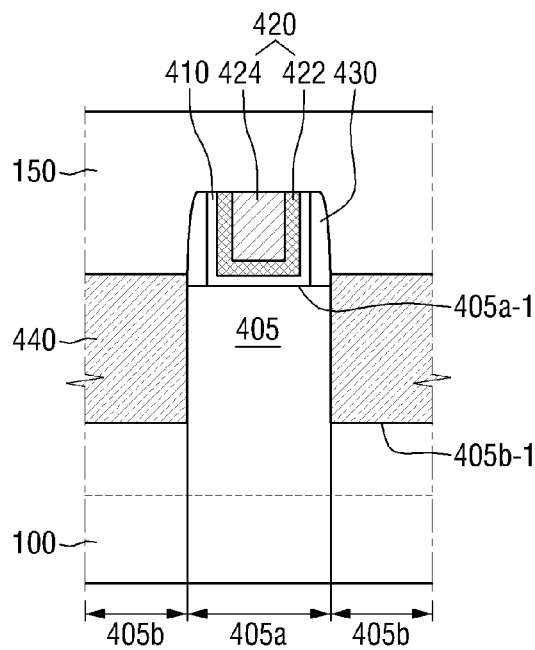
[Fig 31]
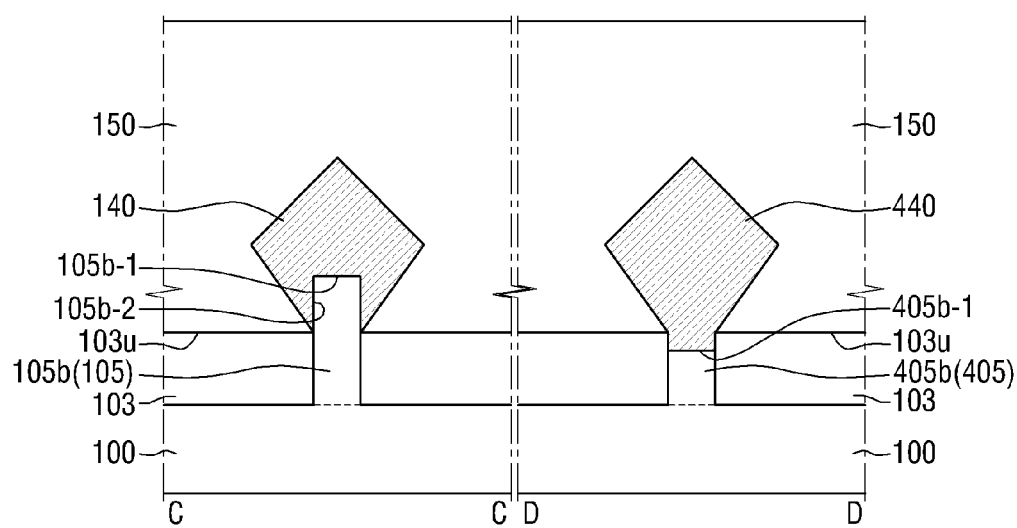

[Fig 32]
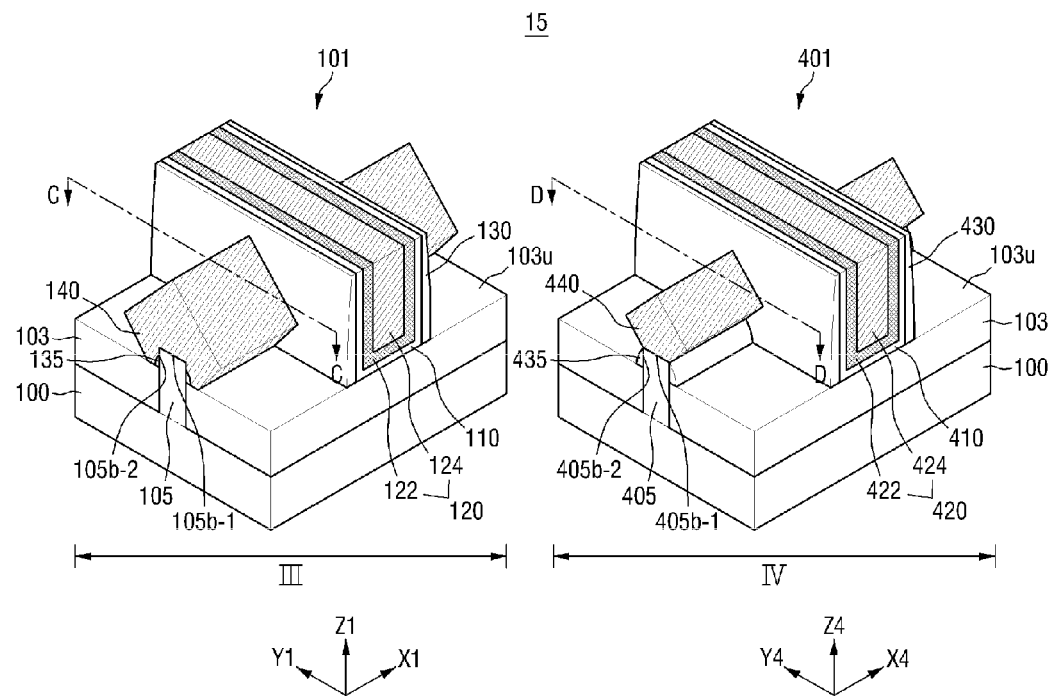

[Fig 33]
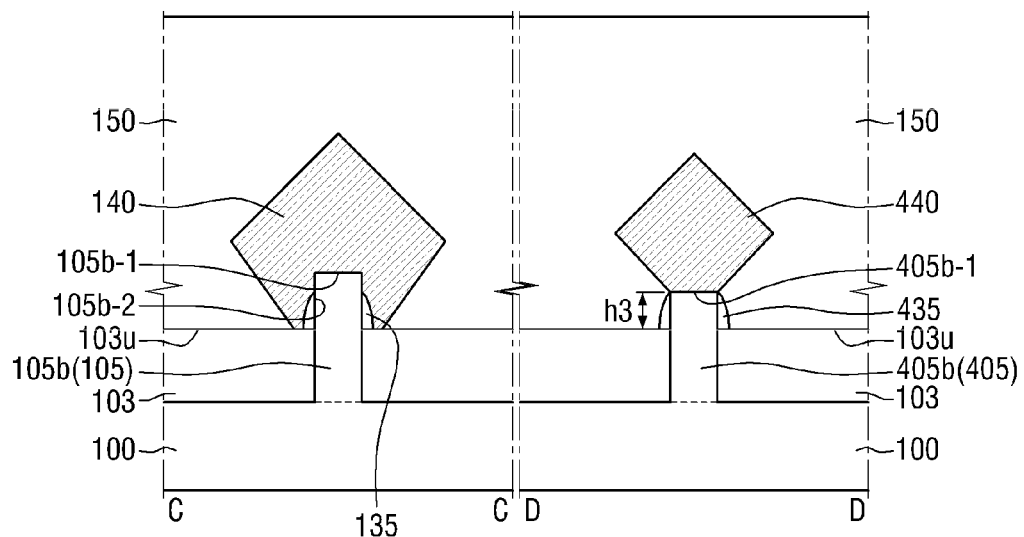
[Fig 34]
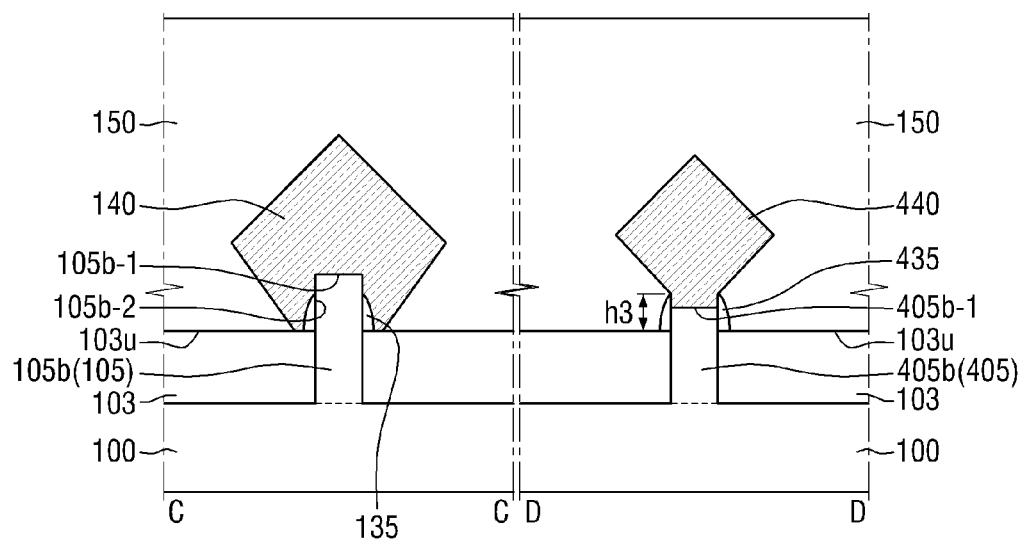

[Fig 35]
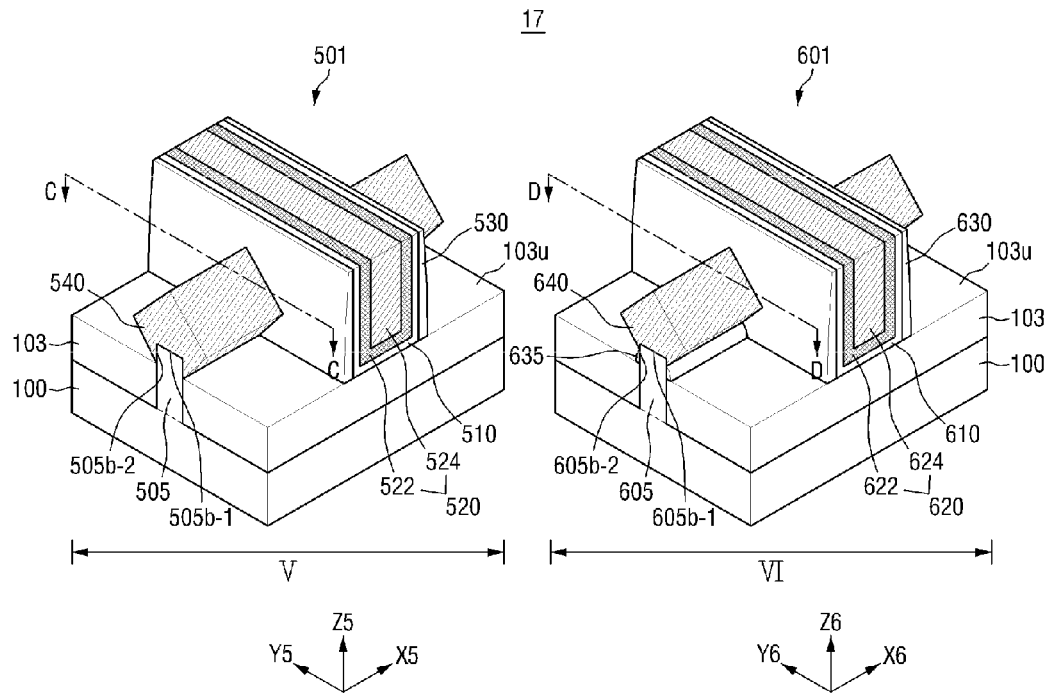
[Fig 36]
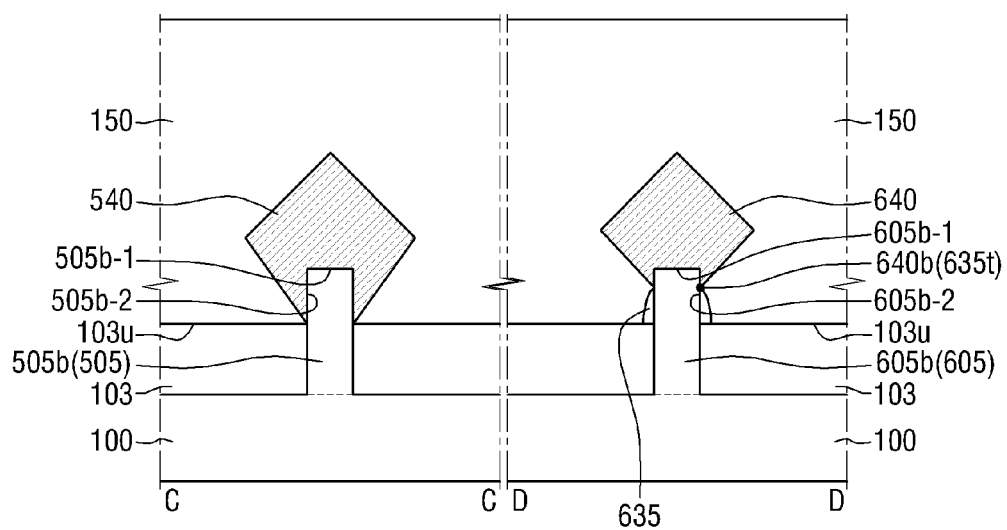

[Fig 37]
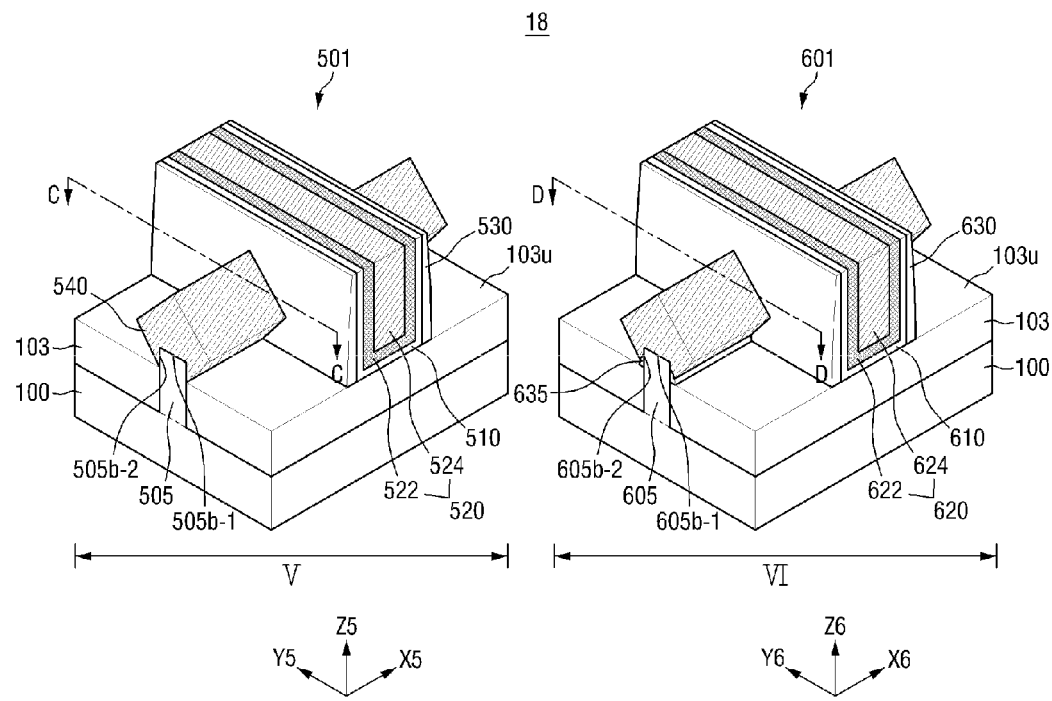
[Fig 38]
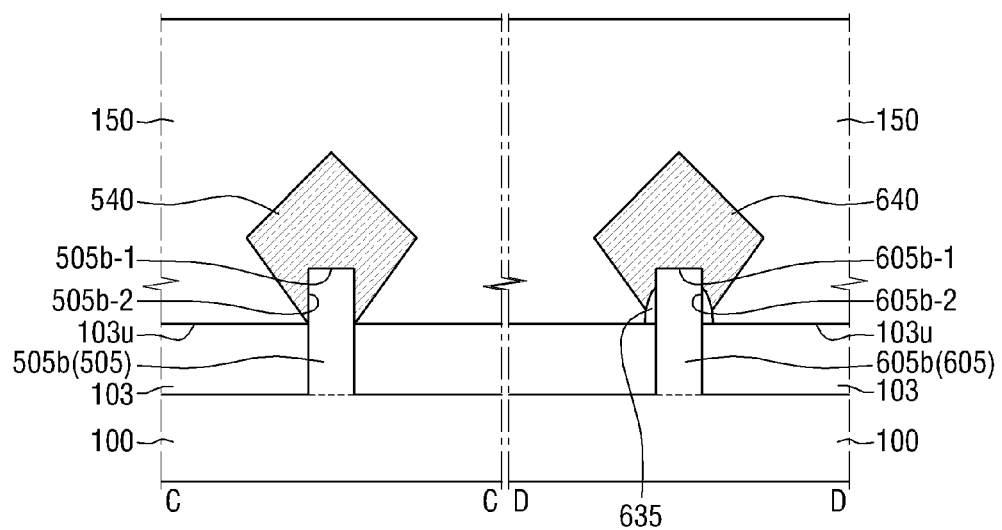

[Fig 39]
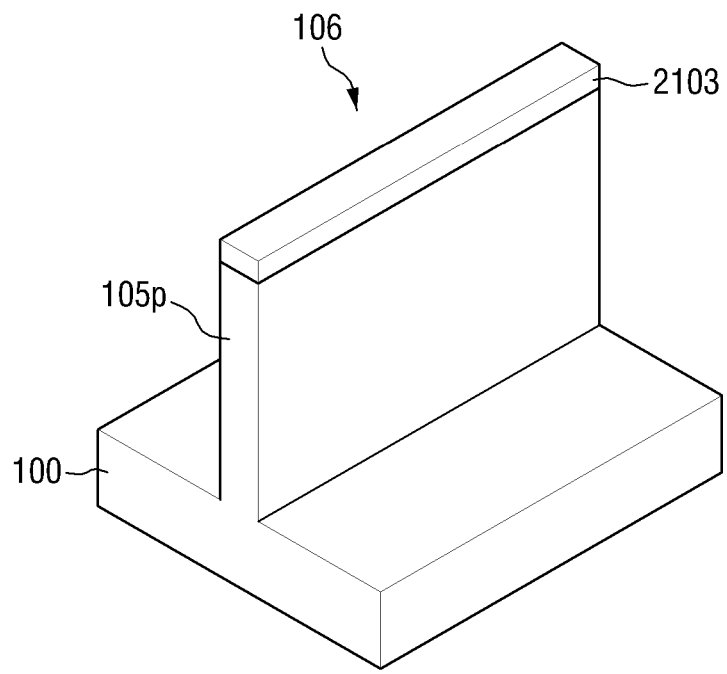

[Fig 40]
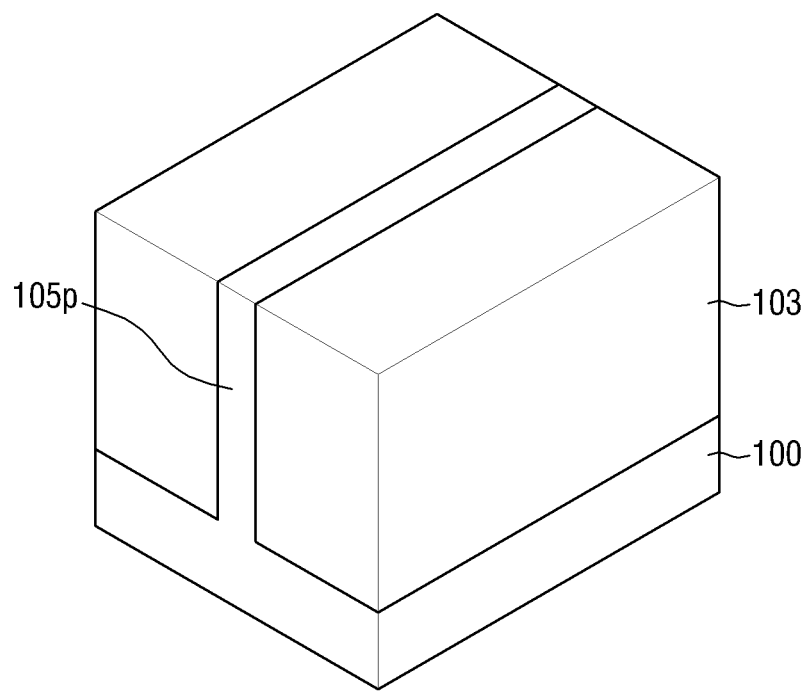

[Fig 41]
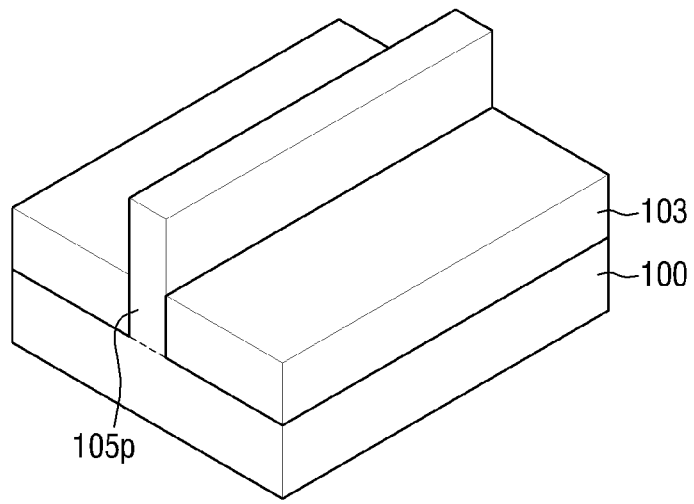
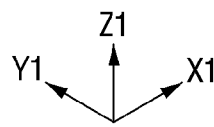
[Fig 42]
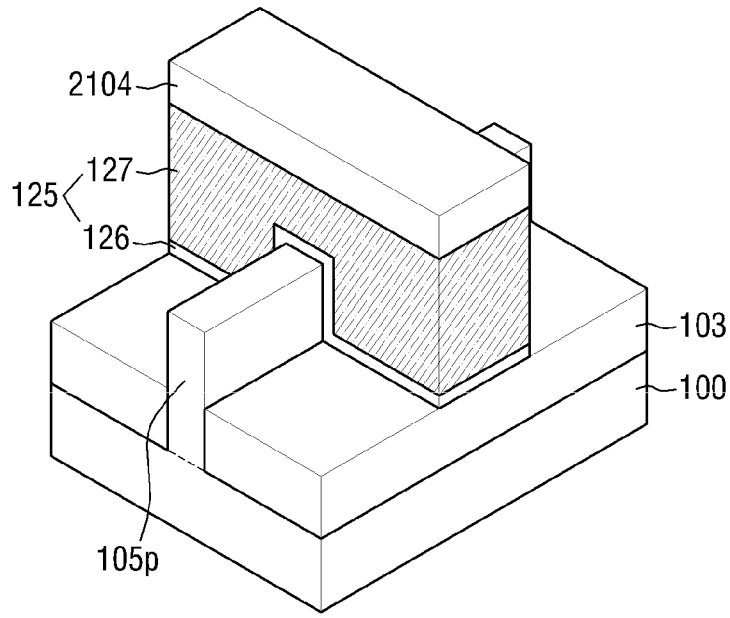
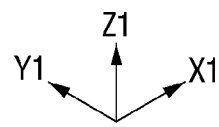

[Fig 43]
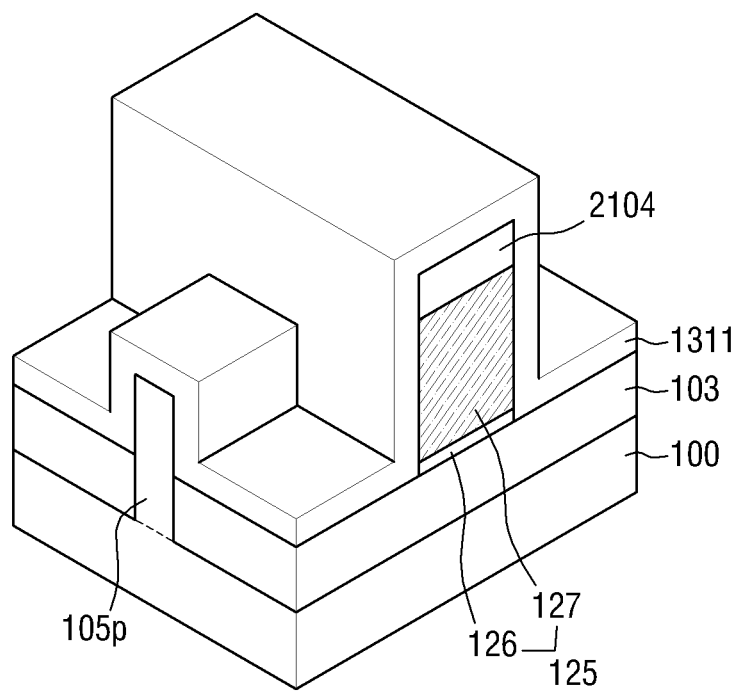

[Fig 44]
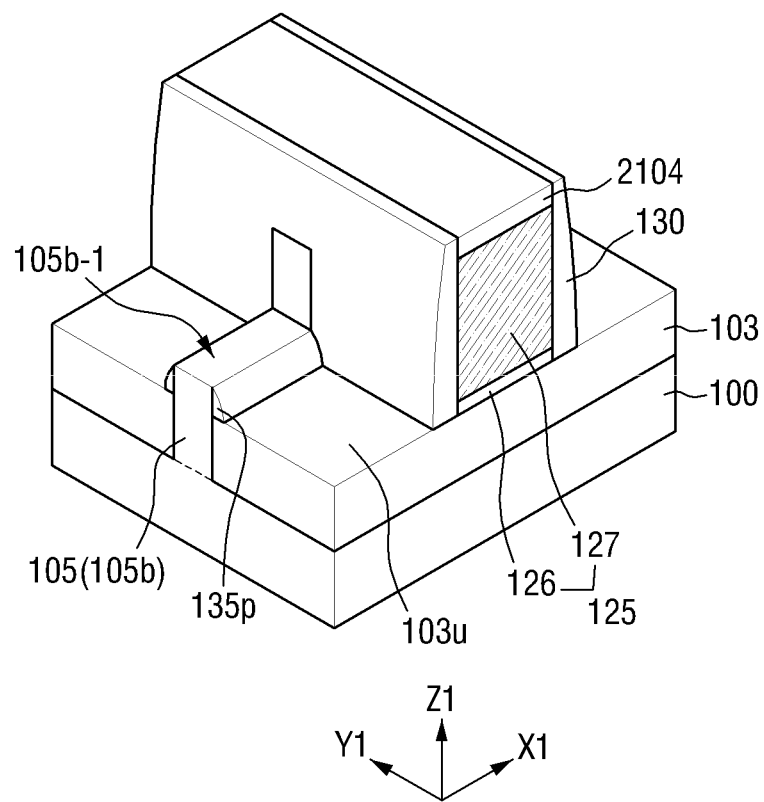

[Fig 45]
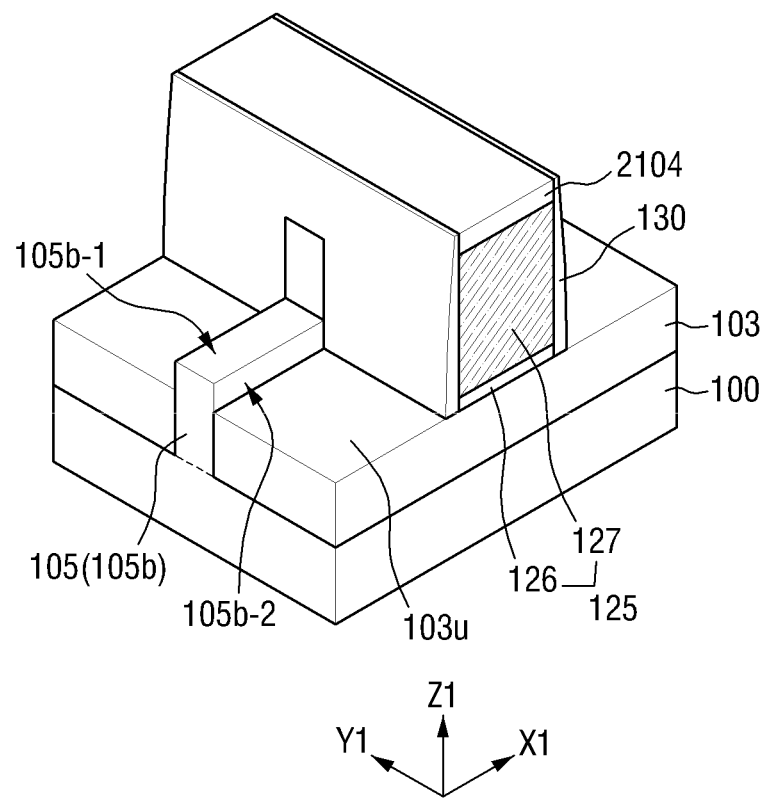

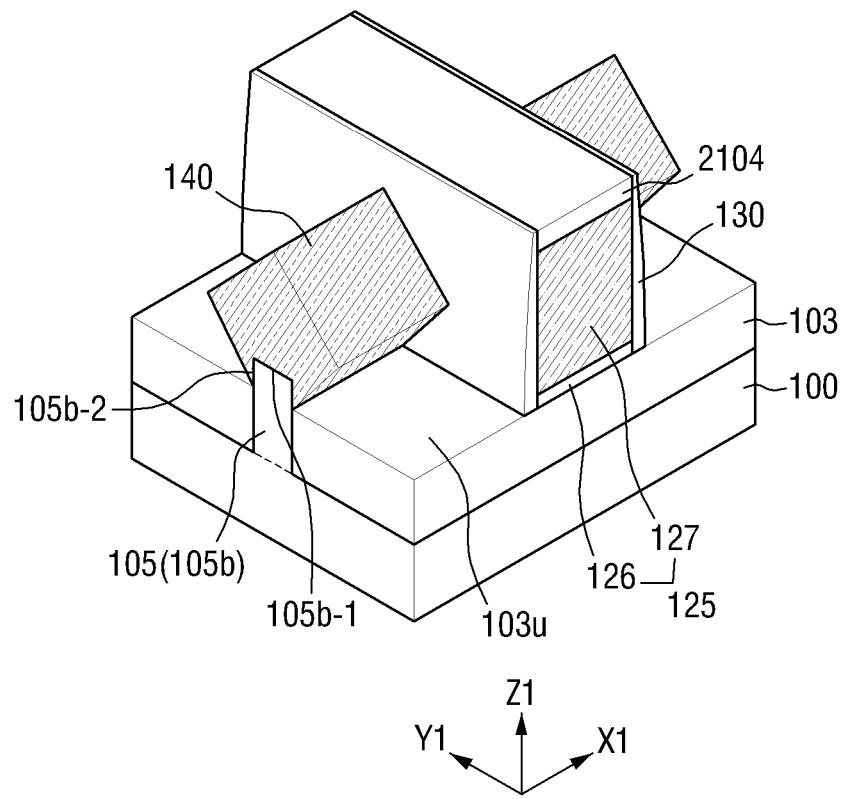
[Fig 46]

[Fig 47]
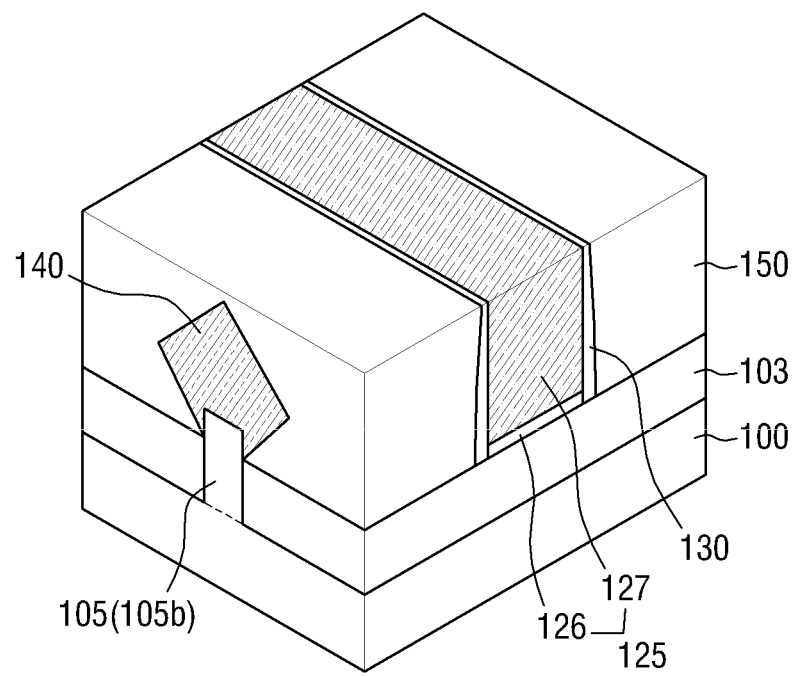

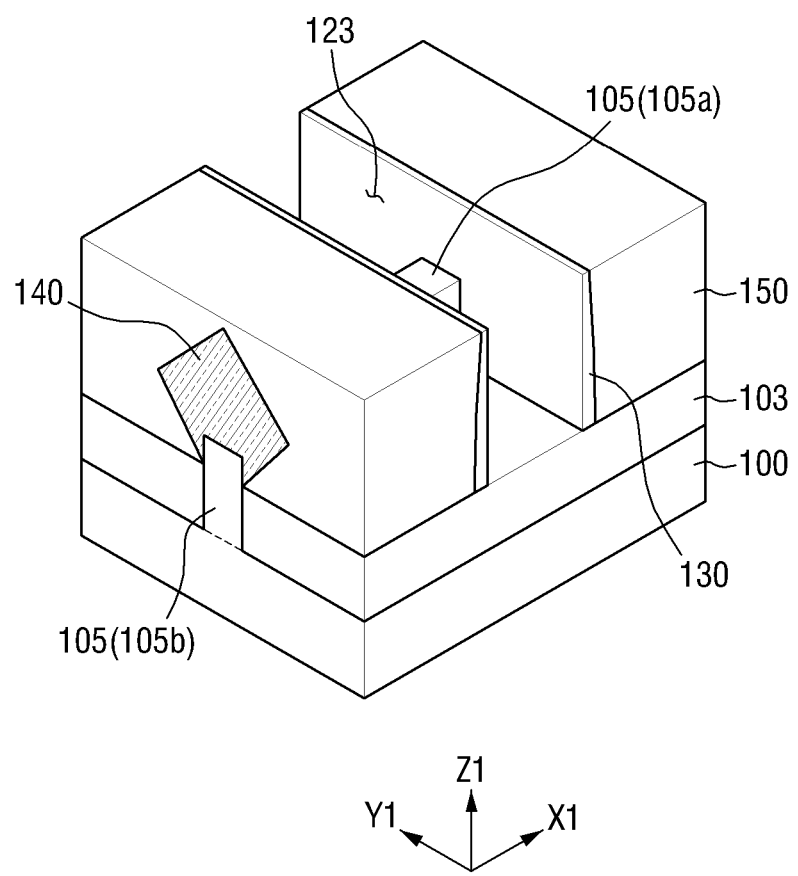
[Fig 48]

[Fig 49]
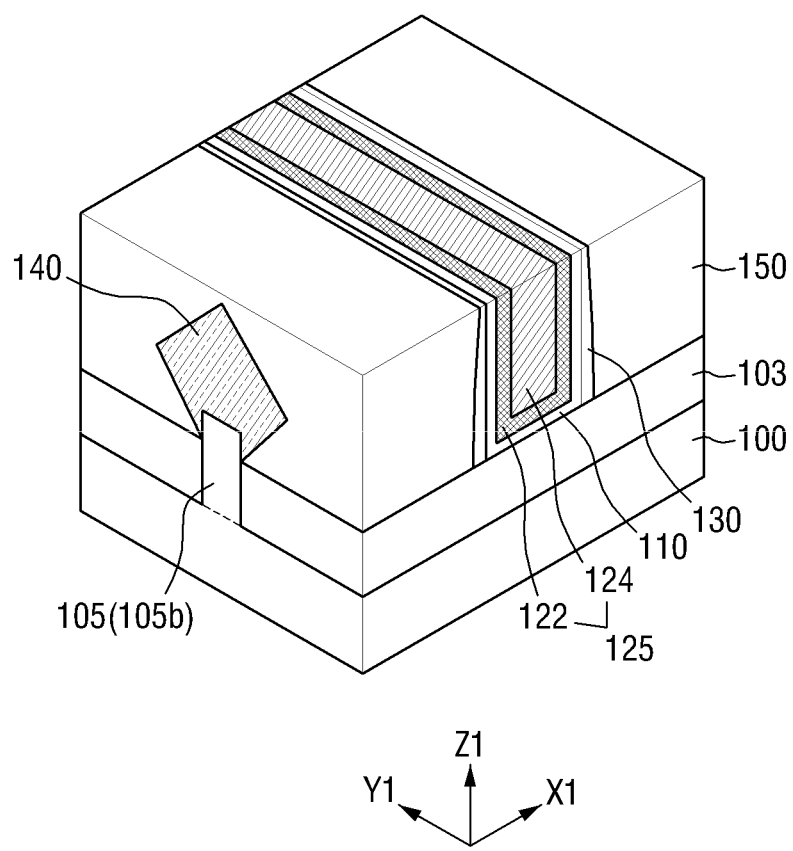

[Fig 50]
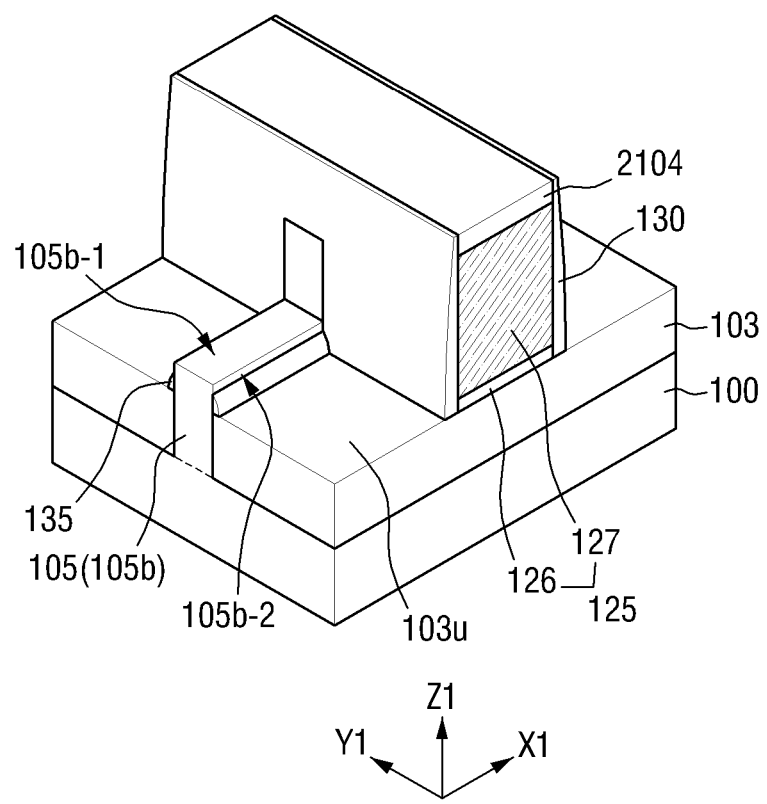

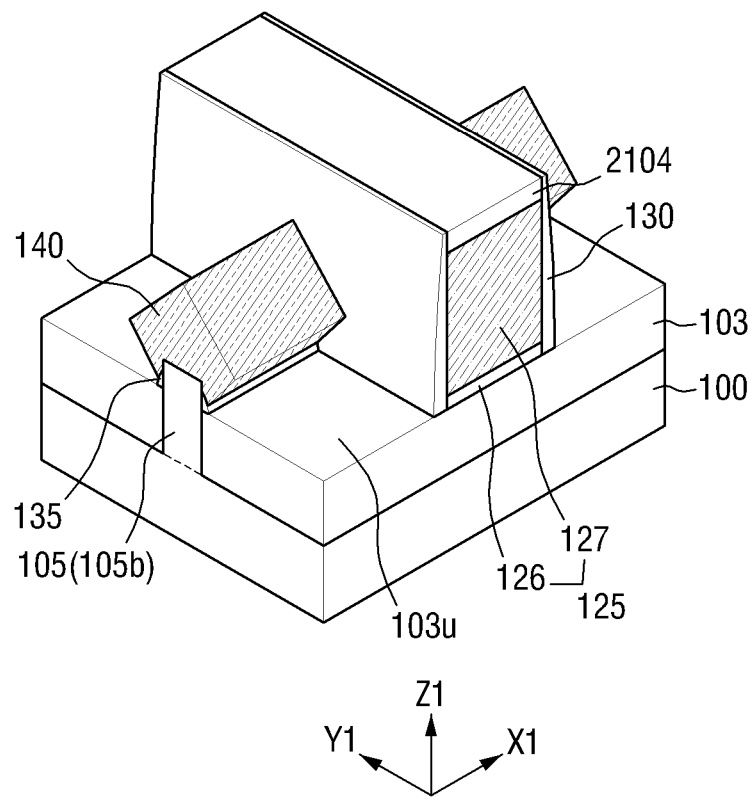
[Fig 51]

【Fig 52】
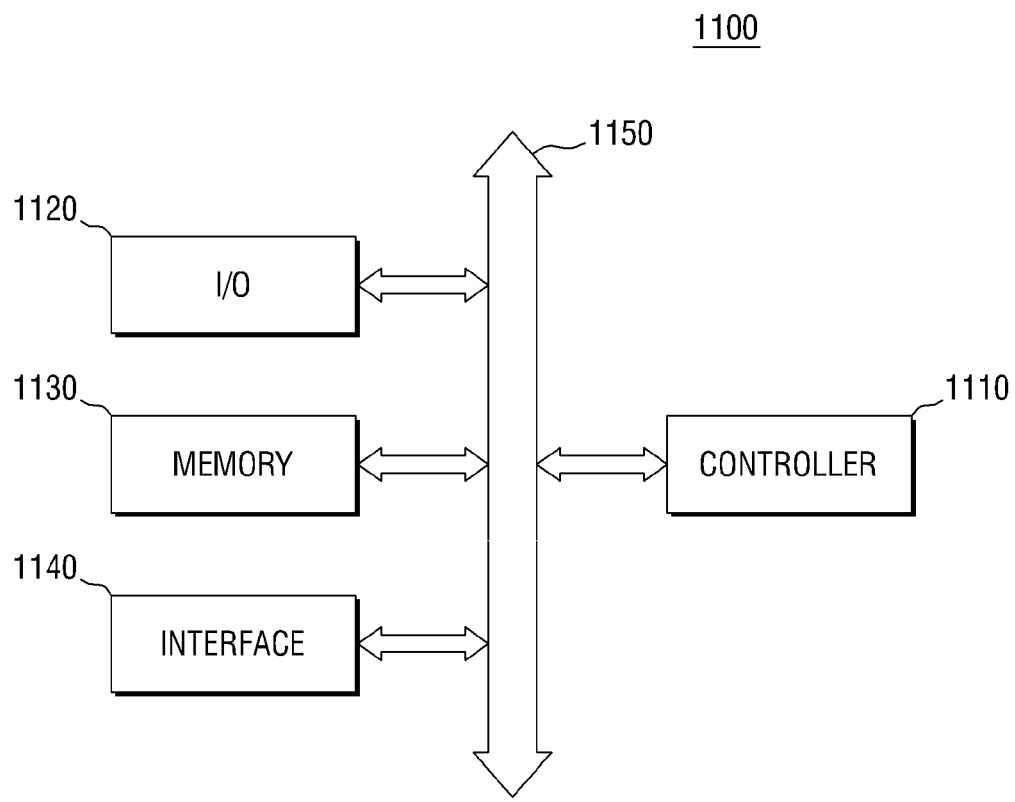
【Fig 53】
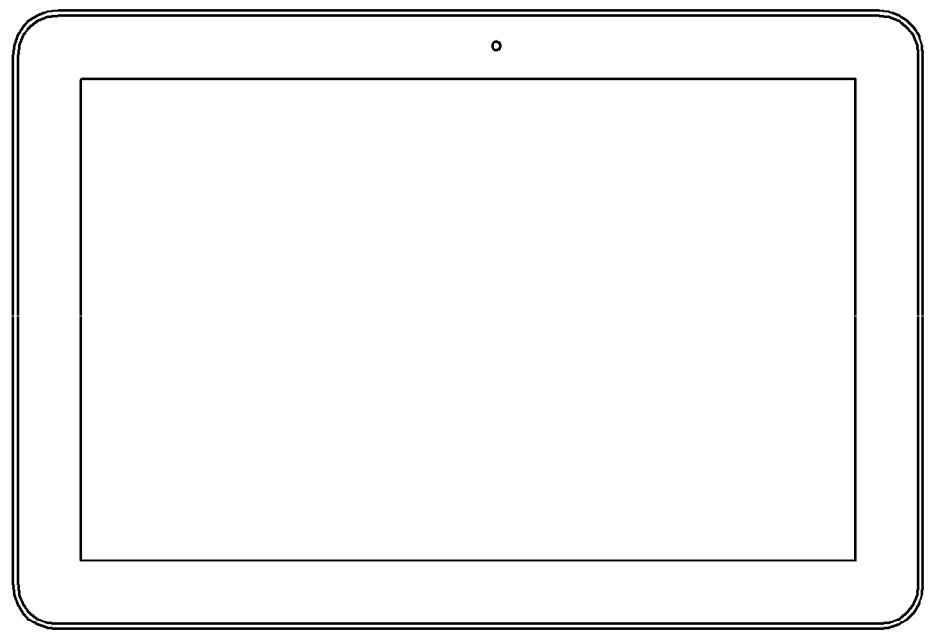

[Fig 54]
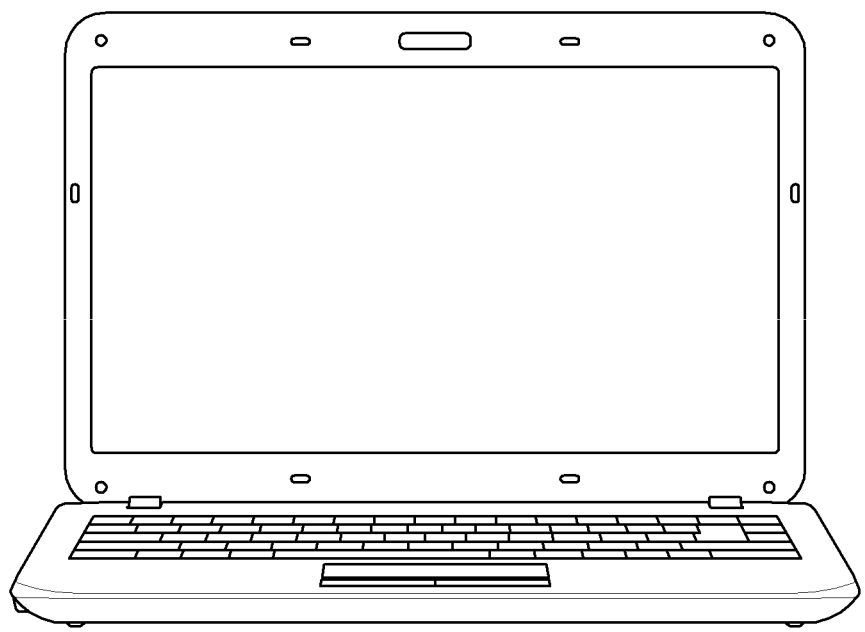

SEMICONDUCTOR DEVICE AND METHOD OF FABRICATING THE SAME

This application is a divisional of and claims priority under 35 U.S.C. § 120 to, U.S. patent application Ser. No. 14/600,142, filed Jan. 20, 2015, which claims priority under 35 U.S.C. § 119 to Korean Patent Application 10-2014-0052532 filed Apr. 30, 2014 in the Korean Intellectual Property Office, the disclosure each of which is incorporated herein in its entirety by reference.

BACKGROUND

1. Field of the Invention

The present invention relates to a semiconductor device and a method of fabricating the same.

2. Description of the Related Art

As one of scaling techniques for increasing the density of a semiconductor device, a multi-gate transistor has been suggested. The multi-gate transistor includes a fin-shaped silicon body formed on a substrate and gates formed on the surface of the silicon body.

The multi-gate transistor can be easily scaled because it uses a three-dimensional (3D) channel. In addition, the current control capability can be improved without the need to increase the gate length of the multi-gate transistor. Moreover, it is possible to effectively suppress a short channel effect (SCE) in which an electric potential of a channel region is affected by a drain voltage.

SUMMARY

Aspects of the present invention provide a semiconductor device in which a portion of a multi-channel active pattern is made to protrude further upward than a field insulating layer and/or fin spacers in order to increase the volume of a source/drain region formed on the protruding portion of the multi-channel active pattern, thereby improving element characteristics.

Aspects of the present invention also provide a method of fabricating the semiconductor device.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a semiconductor device comprising a first multi-channel active pattern which is defined by a field insulating layer, extends along a first direction, and includes a first portion and a second portion; a gate electrode which extends along a second direction different from the first direction and is formed on the first portion; and a first source/drain region which is formed around the second portion protruding further upward than a top surface of the field insulating layer and contacts the field insulating layer, wherein the second portion is disposed on both sides of the first portion in the first direction and is more recessed than the first portion, a top surface of the first portion and a top surface of the second portion protrude further upward than the top surface of the field insulating layer, and a profile of sidewalls of the second portion is continuous.

The first source/drain region is formed on the top surface and sidewalls of the second portion which protrudes further upward than the top surface of the field insulating layer.

The whole of the second portion protruding further upward than the top surface of the field insulating layer directly contacts the first source/drain region.

The first source/drain region contacts the field insulating layer along the top surface of the field insulating layer.

The semiconductor device may further comprise fin spacers which are formed on part of the sidewalls of the second portion protruding further upward than the top surface of the field insulating layer.

A part of the second portion protrudes further upward than the fin spacers.

Each of the fin spacers includes an inner side surface which is adjacent to the second portion and an outer side surface which faces the inner side surface, and the first source/drain region contacts the fin spacers along the outer side surfaces of the fin spacers.

The first source/drain region contacts the field insulating layer along the top surface of the field insulating layer.

The semiconductor device may further comprise a second multi-channel active pattern which extends along the first direction, includes a third portion and a fourth portion, and is adjacent to the first multi-channel active pattern; and a second source/drain region which is formed around the fourth portion protruding further upward than the top surface of the field insulating layer and contacts the field insulating layer, the fourth portion is more recessed than the third portion, a top surface of the third portion and a top surface of the fourth portion protrude further upward than the top surface of the field insulating layer, the gate electrode is formed on the third portion, and the second source/drain region is formed on both sides of the gate electrode.

The second source/drain region contacts the first source/drain region.

Each of the first source/drain region and the second source/drain region contacts the field insulating layer along the top surface of the field insulating layer.

If a width of a reference source/drain region formed on a portion of a reference multi-channel active pattern which is recessed to lie in the same plane with the top surface of the field insulating layer is w1, if a width of the first source/drain region is w2, and if a height of the first portion protruding further upward than the field insulating layer is a, w1 and w2 have a relationship defined by Equation (1):

$$w2 = w1 + 2 \times a/1.4 \tag{1}.$$

The reference source/drain region and the first source/drain region comprise SiGe.

A height from the top surface of the field insulating layer to the top surface of the first portion is a first height, and a height from the top surface of the field insulating layer to the top surface of the second portion is a second height, wherein the first height is greater than the second height.

An outer circumferential surface of the first source/drain region has at least one of a diamond shape, a circular shape, and a rectangular shape.

The first multi-channel active pattern is a fin-type active pattern.

According to another aspect of the present invention, there is provided a semiconductor device comprising a multi-channel active pattern which is defined by a field insulating layer, extends along a first direction, and includes a first portion and a second portion; a gate electrode which extends along a second direction different from the first direction and is formed on the first portion; fin spacers which are formed on part of sidewalls of the second portion protruding further upward than a top surface of the field insulating layer; and a source/drain region which covers at least part of the fin spacers and contacts a top surface and the sidewalls of the second portion protruding further than the fin spacers, the second portion is disposed on both sides of the first portion in the first direction and is more recessed than the first portion, and a top surface of the first portion and the top surface of the second portion protrude further upward than the top surface of the field insulating layer.

The source/drain region partially covers the fin spacers.

Each of the fin spacers comprises an inner side surface which is adjacent to the second portion protruding further upward than the top surface of the field insulating layer and an outer side surface which faces the inner side surface, wherein upper parts of the outer side surfaces of the fin spacers contact the source/drain region, and lower parts of the outer side surfaces of the fin spacers do not contact the source/drain region.

The semiconductor device may further comprise gate spacers which are formed on sidewalls of the gate electrode, wherein the gate spacers and the fin spacers are connected to each other.

The source/drain region contacts the field insulating layer.

According to still another aspect of the present invention, there is provided a semiconductor device comprising a substrate which comprises a first region and a second region; a first transistor which is formed in the first region; and a second transistor which is formed in the second region, the first transistor comprises a first multi-channel active pattern which is defined by a field insulating layer, extends along a first direction, and includes a first portion and a second portion; a first gate electrode which extends along a second direction different from the first direction and is formed on the first portion; and a first source/drain region which is formed on both sides of the first gate electrode to contact a top surface and sidewalls of the second portion protruding further upward than a top surface of the field insulating layer and contacts the field insulating layer, and the second transistor comprises a second multi-channel active pattern which is defined by the field insulating layer, extends along a third direction, and includes a third portion and a fourth portion; a second gate electrode which extends along a fourth direction different from the third direction and is formed on the third portion; and a second source/drain region which is formed on both sides of the second gate electrode to contact a top surface and sidewalls of the fourth portion protruding further upward than the top surface of the field insulating layer, contacts the field insulating layer, and has a different conductivity type from that of the first source/drain region, and the second portion is more recessed than the first portion, a top surface of the first portion and the top surface of the second portion protrude further upward than the top surface of the field insulating layer, the fourth portion is more recessed than the third portion, a top surface of the third portion and the top surface of the fourth portion protrude further upward than the top surface of the field insulating layer, a profile of the sidewalls of the second portion is continuous, and a profile of the sidewalls of the fourth portion is continuous.

A region in which the first source/drain region and the field insulating layer contact each other is the first region, and a region in which the second source/drain region and the field insulating layer contact each other is the second region, and the area of the second region and the area of the first region are different from each other.

According to still another aspect of the present invention, there is provided a semiconductor device comprising a substrate which comprises a first region and a second region; a first transistor which is formed in the first region; and a second transistor which is formed in the second region, the first transistor comprises a first multi-channel active pattern which is defined by a field insulating layer, extends along a first direction, and includes a first portion and a second portion; a first gate electrode which extends along a second direction different from the first direction and is formed on the first portion; first fin spacers which are formed on part of sidewalls of the second portion protruding further than a top surface of the field insulating layer; and a first source/drain region which is formed on both sides of the first gate electrode to contact a top surface and the sidewalls of the second portion protruding further than the first fin spacers, and the second transistor comprises a second multi-channel active pattern which is defined by the field insulating layer, extends along a third direction, and comprises a third portion and a fourth portion; a second gate electrode which extends along a fourth direction different from the third direction and is formed on the third portion; second fin spacers which are formed on part of sidewalls of the fourth portion protruding further upward than the top surface of the field insulating layer; and a second source/drain region which is formed on both sides of the second gate electrode to contact a top surface and the sidewalls of the fourth portion protruding further upward than the top surface of the field insulating layer and has a different conductivity type from that of the first source/drain region, and the second portion is more recessed than the first portion, a top surface of the first portion and the top surface of the second portion protrude further upward than the top surface of the field insulating layer, the fourth portion is more recessed than the third portion, and a top surface of the third portion and the top surface of the fourth portion protrude further upward than the top surface of the field insulating layer.

A bottommost part of the first source/drain region is formed along topmost parts of the first fin spacers.

The second source/drain region partially covers the second fin spacers.

The second source/drain region contacts the field insulating layer.

According to still another aspect of the present invention, there is provided a semiconductor device comprising a substrate which comprises a first region and a second region; a first transistor which is formed in the first region; and a second transistor which is formed in the second region, wherein the first transistor comprises a first multi-channel active pattern which is defined by a field insulating layer, extends along a first direction, and includes a first portion and a second portion; a first gate electrode which extends along a second direction different from the first direction and is formed on the first portion; and a first source/drain region which is formed on both sides of the first gate electrode to contact a top surface and sidewalls of the second portion protruding further upward than a top surface of the field insulating layer and contacts the field insulating layer, wherein the second transistor comprises a second multi-channel active pattern which is defined by the field insulating layer, extends along a third direction, and includes a third portion and a fourth portion; a second gate electrode which extends along a fourth direction different from the third direction and is formed on the third portion; and a second source/drain region which is formed on the fourth portion on both sides of the second gate electrode, and wherein the second portion is more recessed than the first portion, a top surface of the first portion and the top surface of the second portion protrude further upward than the top surface of the field insulating layer, a top surface of the third portion protrudes further upward than the top surface of the field insulating layer, the top surface of the fourth portion does not protrude further upward than the top surface of the field insulating layer, and a profile of the sidewalls of the second portion is continuous.

The top surface of the field insulating layer and the top surface of the fourth portion lie in the same plane.

The top surface of the fourth portion is more recessed than the top surface of the field insulating layer.

According to still another aspect of the present invention, there is provided a semiconductor device comprising a substrate which comprises a first region and a second region; a first transistor which is formed in the first region; and a second transistor which is formed in the second region, wherein the first transistor comprises a first multi-channel active pattern which is defined by a field insulating layer, extends along a first direction, and includes a first portion and a second portion; a first gate electrode which extends along a second direction different from the first direction and is formed on the first portion; first fin spacers which are formed on part of sidewalls of the second portion protruding further upward than a top surface of the field insulating layer; and a first source/drain region which is formed on both sides of the first gate electrode to cover at least part of the first fin spacers and contact a top surface and the sidewalls of the second portion protruding further than the first fin spacers, wherein the second transistor comprises a second multi-channel active pattern which is defined by the field insulating layer, extends along a third direction, and includes a third portion and a fourth portion; a second gate electrode which extends along a fourth direction different from the third direction and is formed on the third portion; second fin spacers which are formed on sidewalls of the fourth portion; and a second source/drain region which is formed on the fourth portion on both sides of the second gate electrode, and wherein the second portion is more recessed than the first portion, a top surface of the first portion and the top surface of the second portion protrude further upward than the top surface of the field insulating layer, a top surface of the third portion protrudes further upward than the top surface of the field insulating layer, and a top surface of the fourth portion does not protrude further upward than the second fin spacers.

A height of the second fin spacers is equal to a height from the top surface of the field insulating layer to the top surface of the fourth portion.

The top surface of the fourth portion is more recessed than a topmost part of the field insulating layer.

The first source/drain region contacts the field insulating layer.

According to still another aspect of the present invention, there is provided a semiconductor device comprising a field insulating layer which is formed on a substrate; a first multi-channel active pattern which is defined by the field insulating layer, extends along a first direction, and includes a first portion and a second portion; a first gate electrode which extends along a second direction different from the first direction and is formed on the first portion; a first source/drain region which is formed around the second portion protruding further upward than a top surface of the field insulating layer; a second multi-channel active pattern which is defined by the field insulating layer, extends along a third direction, and includes a third portion and a fourth portion; a second gate electrode which extends along a fourth direction different from the third direction and is formed on the third portion; fin spacers which are formed on part of sidewalls of the fourth portion protruding further upward than the top surface of the field insulating layer; and a second source/drain region which is formed to contact a top surface and the sidewalls of the fourth portion protruding further than the fin spacers, wherein the second portion is disposed on both sides of the first portion in the first direction and is more recessed than the first portion, a top surface of the first portion and a top surface of the second portion protrude further upward than the top surface of the field insulating layer, a profile of sidewalls of the second portion is continuous, the fourth portion is disposed on both sides of the third portion in the third direction and is more recessed than the third portion, and a top surface of the third portion and the top surface of the fourth portion protrude further upward than the top surface of the field insulating layer.

The second source/drain region covers at least part of the fin spacers.

According to still another aspect of the present invention, there is provided a semiconductor device comprising forming a multi-channel active pattern which is defined by a field insulating layer, extends along a first direction and includes a first portion and a second portion, forming a gate electrode which extends along a second direction different from the first direction and is disposed on the first portion to intersect the multi-channel active pattern, and forming pre-fin spacers on sidewalls of the second portion protruding further upward than a top surface of the field insulating layer; exposing at least part of the sidewalls of the second portion which protrudes further upward than the top surface of the field insulating layer by removing at least part of the pre-fin spacers; and forming a source/drain region to contact the exposed sidewalls of the second portion and a top surface of the second portion, wherein the second portion is more recessed than the first portion, and a top surface of the first portion and the top surface of the second portion protrude further upward than the top surface of the field insulating layer.

The forming of the multi-channel active pattern and the pre-fin spacers comprises forming a pre-multi-channel active pattern to protrude further upward than the field insulating layer; forming the gate electrode to intersect the pre-multi-channel active pattern; forming a spacer layer on the field insulating layer to cover the gate electrode and the pre-multi-channel active pattern; and partially etching the spacer layer and the pre-multi-channel active pattern.

The exposing of the at least part of the sidewalls of the second portion by removing the at least part of the pre-fin spacers comprises completely exposing the sidewalls of the second portion which protrudes further upward than the top surface of the field insulating layer by completely removing the pre-fin spacers, and the whole of the second portion protruding further upward than the top surface of the field insulating layer directly contacts the source/drain region.

The exposing of the at least part of the sidewalls of the second portion by removing the at least part of the pre-fin spacers comprises forming fin spacers on part of the sidewalls of the second portion which protrudes further upward than the top surface of the field insulating layer by partially removing the pre-fin spacers, and the source/drain region covers at least part of the fin spacers.

BRIEF DESCRIPTION OF THE DRAWINGS

The above and other aspects and features of the present invention will become more apparent by describing in detail exemplary embodiments thereof with reference to the attached drawings, in which:

FIG. 1 is a perspective view of a semiconductor device according to a first embodiment of the present invention;

FIGS. 2, 3 and 4 are cross-sectional views of the semiconductor device taken along the lines A-A, B-B and C-C of FIG. 1, respectively;

FIG. 5 is a view illustrating the effects of the semiconductor device of FIG. 1;

FIGS. 6 through 7B are cross-sectional views of modified examples of the semiconductor device according to the first embodiment of the present invention;

FIG. 8 is a perspective view of a semiconductor device according to a second embodiment of the present invention;

FIG. 9 is a cross-sectional view taken along the line C-C of FIG. 8;

FIG. 10 is a perspective view of a semiconductor device according to a third embodiment of the present invention;

FIG. 11 is a cross-sectional view taken along the line C-C of FIG. 10;

FIG. 12 is a perspective view of a semiconductor device according to a fourth embodiment of the present invention;

FIG. 13 is a cross-sectional view taken along the line C-C of FIG. 12;

FIG. 14 is a perspective view of a semiconductor device according to a fifth embodiment of the present invention;

FIG. 15 is a cross-sectional view taken along the lines B1-B1 and B2-B2 of FIG. 14;

FIG. 16 is a cross-sectional view taken along the line C-C of FIG. 14;

FIG. 17 is a cross-sectional view of a semiconductor device according to a sixth embodiment of the present invention;

FIG. 18 is a cross-sectional view of a semiconductor device according to a seventh embodiment of the present invention;

FIG. 19 is a cross-sectional view of a semiconductor device according to an eighth embodiment of the present invention;

FIG. 20 is a perspective view of a semiconductor device according to a ninth embodiment of the present invention;

FIG. 21 is a cross-sectional view taken along the lines C-C and D-D of FIG. 20;

FIG. 22 is a perspective view of a semiconductor device according to a tenth embodiment of the present invention;

FIG. 23 is a cross-sectional view taken along the lines C-C and D-D of FIG. 22;

FIG. 24 is a perspective view of a semiconductor device according to an eleventh embodiment of the present invention;

FIG. 25 is a cross-sectional view taken along the lines C-C and D-D of FIG. 24;

FIG. 26 is a perspective view of a semiconductor device according to a twelfth embodiment of the present invention;

FIG. 27 is a cross-sectional view taken along the lines C-C and D-D of FIG. 26;

FIG. 28 is a perspective view of a semiconductor device according to a thirteenth embodiment of the present invention;

FIG. 29 is a cross-sectional view taken along the lines C-C and D-D of FIG. 28;

FIG. 30 is a cross-sectional view taken along the line E-E of FIG. 28;

FIG. 31 is a cross-sectional view of a semiconductor device according to a fourteenth embodiment of the present invention;

FIG. 32 is a perspective view of a semiconductor device according to a fifteenth embodiment of the present invention;

FIG. 33 is a cross-sectional view taken along the lines C-C and D-D of FIG. 32;

FIG. 34 is a cross-sectional view of a semiconductor device according to a sixteenth embodiment of the present invention;

FIGS. 35 and 36 are views of a semiconductor device according to a seventeenth embodiment of the present invention;

FIGS. 37 and 38 are views of a semiconductor device according to an eighteenth embodiment of the present invention;

FIGS. 39 through 49 are views illustrating steps of a method of fabricating a semiconductor device according to an embodiment of the present invention;

FIGS. 50 and 51 are views illustrating steps of a method of fabricating a semiconductor device according to another embodiment of the present invention;

FIG. 52 is a block diagram of an electronic system including semiconductor devices according to embodiments of the present invention; and FIGS. 53 and 54 are diagrams illustrating examples of a semiconductor system to which semiconductor devices according to embodiments of the present invention can be applied.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

A semiconductor device according to a first embodiment of the present invention will now be described with reference to FIGS. 1 through 4.

FIG. 1 is a perspective view of a semiconductor device 1 according to a first embodiment of the present invention. FIGS. 2, 3 and 4 are cross-sectional views of the semiconductor device 1 taken along the lines A-A, B-B and C-C of FIG. 1, respectively. For ease of description, an interlayer insulating film 150 is not illustrated in FIG. 1.

Referring to FIGS. 1 through 4, the semiconductor device 1 according to the first embodiment of the present invention may include a substrate 100, a field insulating layer 103, a first multi-channel active pattern 105, a first gate electrode 120, first gate spacers 130, first source/drain regions 140, etc.

The substrate 100 may be, for example, a bulk silicon substrate or a silicon-on-insulator (SOI) substrate. Otherwise, the substrate 100 may be a silicon substrate or may be a substrate formed of another material such as silicon germanium, indium antimonide, lead telluride, indium arsenide, indium phosphide, gallium arsenide, or gallium antimonide. Alternatively, the substrate 100 may consist of a base substrate and an epitaxial layer formed on the base substrate.

The first multi-channel active pattern 105 may protrude from the substrate 100. The field insulating layer 103 may partially cover side surfaces of the first multi-channel active pattern 105. Therefore, the first multi-channel active pattern 105 may protrude further upward than the field insulating layer 103 formed on the substrate 100. The first multi-channel active pattern 105 is defined by the field insulating layer 103.

The first multi-channel active pattern 105 may extend along a first direction X1. The first multi-channel active pattern 105 includes a first portion 105a and a second portion 105b. The second portion 105b of the first multi-channel active pattern 105 is disposed on both sides of the first portion 105a of the first multi-channel active pattern 105 in the first direction X1.

A top surface 105b-1 of the second portion 105b of the first multi-channel active pattern 105 and a top surface 105a-1 of the first portion 105a of the first multi-channel active pattern 105 protrude further upward than a top surface 103u of the field insulating layer 103. That is, the first portion 105a of the first multi-channel active pattern 105 and the second portion 105b of the first multi-channel active pattern 105 protrude further upward than the field insulating layer 103.

The second portion 105b of the first multi-channel active pattern 105 is more recessed than the first portion 105a of the first multi-channel active pattern 105. In other words, the top surface 105b-1 of the second portion 105b of the first multi-channel active pattern 105 is located more adjacent to the top surface 103u of the field insulating layer 103 than the top surface 105a-1 of the first portion 105a of the first multi-channel active pattern 105. Assuming that a height from the top surface 103u of the field insulating layer 103 to the top surface 105a-1 of the first portion 105a of the first multi-channel active pattern 105 is a first height h1 and that a height from the top surface 103u of the field insulating layer 103 to the top surface 105b-1 of the second portion 105b of the first multi-channel active pattern 105 is a second height h2, the first height h1 is greater than the second height h2.

For ease of description, the top surface 103u of the field insulating layer 103 is illustrated in the drawings as being flat, but the present invention is not limited thereto. In semiconductor devices according to embodiments of the present invention, the first height h1 and the second height h2 are measured based on a point at which the first multi-channel active pattern 105 contacts the field insulating layer 103.

The profile of sidewalls of the second portion 105b of the first multi-channel active pattern 105 is continuous. Specifically, the second portion 105b of the first multi-channel active pattern 105 includes a portion which contacts the field insulating layer 103 and a portion which protrudes further upward than the field insulating layer 103 without contacting the field insulating layer 103. Here, the profile of sidewalls of the second portion 105b of the first multi-channel active pattern 105 which contacts the field insulating layer 103 is continuous with the profile of sidewalls 105b-2 of the second portion 105b of the first multi-channel active pattern 105 which protrudes further upward than the field insulating layer 103.

In other words, at a boundary between the second portion 105b of the first multi-channel active pattern 105 and the top surface 103u of the field insulating layer 103, a width of the second portion 105b of the first multi-channel active pattern 105 which protrudes further upward than the field insulating layer 103 is equal to a width of the second portion 105b of the first multi-channel active pattern 105 which contacts the field insulating layer 103.

The first multi-channel active pattern 105 may be part of the substrate 100 and may include an epitaxial layer grown from the substrate 100. The first multi-channel active pattern 105 may include an element semiconductor material such as silicon or germanium. In addition, the first multi-channel active pattern 105 may include a compound semiconductor such as a group IV-IV compound semiconductor or a group III-V compound semiconductor. Specifically, the group IV-IV compound semiconductor that forms the first multi-channel active pattern 105 may be a binary or ternary compound containing two or more of carbon (C), silicon (Si), germanium (Ge) and tin (Sn) or a compound obtained by doping the binary or ternary compound with a group IV element. The group III-V compound semiconductor that forms the first multi-channel active pattern 105 may be a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

In semiconductor devices according to embodiments of the present invention, the first multi-channel active pattern 105 may contain silicon.

In addition, in semiconductor devices according to embodiments of the present invention, the first multi-channel active pattern 105 may be, but is not limited to, a fin-type active pattern. A case where the first multi-channel active pattern 105 is not a fin-type active pattern will be described later with reference to FIG. 6.

The first gate electrode 120 may extend along a second direction Y1 and intersect the first multi-channel active pattern 105. The first gate electrode 120 may be formed on the first multi-channel active pattern 105 and the field insulating layer 103. More specifically, the first gate electrode 120 is formed on the first portion 105a of the first multi-channel active pattern 105.

The first gate electrode 120 may include metal layers (122, 124). As illustrated in the drawings, the first gate electrode 120 may be a stack of two or more metal layers (122, 124). A first metal layer 122 may control a work function, and a second metal layer 124 may fill a space formed by the first metal layer 122. For example, the first metal layer 122 may include at least one of TiN, TaN, TiC, and TaC. In addition, the second metal layer 124 may include W or Al. Alternatively, the first gate electrode 120 may be made of a material (e.g., Si or SiGe) other than metal. The first gate electrode 120 may be formed by, but not limited to, a replacement process.

A first gate insulating layer 110 may be formed between the first multi-channel active pattern 105 and the first gate electrode 120. The first gate insulating layer 110 may be formed on the top surface 150a-1 and side surfaces of the first portion 105a of the first multi-channel active pattern 105. In addition, the first gate insulating layer 110 may be disposed between the first gate electrode 120 and the field insulating layer 103. The first gate insulating layer 110 may include a high-k material having a higher dielectric constant than a silicon oxide layer. For example, the first gate insulating layer 110 may include one or more of, but not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The first gate spacers 130 may respectively be formed on sidewalls of the first gate electrode 120 extending along the second direction Y1. The first gate spacers 130 may include at least one of silicon nitride (SiN), silicon oxynitride (SiON), silicon oxide (SiO$_2$), silicon oxycarbonitride (SiOCN), and combinations of the same. In the drawings, each of the first gate spacers 130 is illustrated as a single layer. However, the present invention is not limited thereto, and each of the first gate spacers 130 can also have a multilayer structure.

The first source/drain regions 140 are respectively formed on the first multi-channel active pattern 105 on both sides of the first gate electrode 120. In other words, the first source/drain regions 140 are respectively formed on the second portions 105b of the first multi-channel active pattern 105.

An outer circumferential surface of each of the first source/drain regions 140 may have various shapes. For example, the outer circumferential surface of each of the first source/drain regions 140 may have at least one of a diamond shape, a circular shape, and a rectangular shape. In FIGS. 1 and 4, the diamond shape (or a pentagonal shape or a hexagonal shape) is illustrated.

Each of the first source/drain regions 140 is formed around the second portion 105b of the first multi-channel active pattern 105 which protrudes further upward than the top surface 103u of the field insulating layer 103. More specifically, each of the first source/drain regions 140 is formed on the top surface 105b-1 and the sidewalls 105b-2 of the second portion 105b of the first multi-channel active pattern 105 which protrudes further upward than the top surface 103u of the field insulating layer 103.

In the semiconductor device 1 according to the first embodiment of the present invention, the whole of the second portion 105b of the first multi-channel active pattern 105 which protrudes further upward than the top surface 103u of the field insulating layer 103 directly contacts each of the first source/drain regions 140. That is, a height at which the first source/drain regions 140 contact the first multi-channel active pattern 105 is substantially equal to a height of the sidewalls 105b-2 of the second portion 105b of the first multi-channel active pattern 105 which protrudes further upward than the top surface 103u of the field insulating layer 103.

The first source/drain regions 140 contact the field insulating layer 103. The first source/drain regions 140 are formed higher (in an upward direction Z1) than a boundary between the first multi-channel active pattern 105 and the field insulating layer 103. A bottommost part of each of the first source/drain regions 140 is formed along the boundary between the field insulating layer 103 and the first multi-channel active pattern 105. Therefore, an inner circumferential surface of each of the first source/drain regions 140 contacts the second portion 105b of the first multi-channel active pattern 105 and is formed along the top surface 105b-1 and the sidewalls 105b-2 of the second portion 105b of the first multi-channel active pattern 105 which protrudes further upward than the top surface 103u of the field insulating layer 103.

If the semiconductor device 1 according to the first embodiment of the present invention is a p-channel metal oxide semiconductor (PMOS) transistor, the first source/drain regions 140 may include a compressive stress material. The compressive stress material may be a material (e.g., SiGe) having a greater lattice constant than Si. The compressive stress material may improve the mobility of carriers in a channel region by applying compressive stress to the first multi-channel active pattern 105 (e.g., the first portion 105a of the first multi-channel active pattern 105).

On the other hand, if the semiconductor device 1 according to the first embodiment of the present invention is an n-channel metal oxide semiconductor (NMOS) transistor, the first source/drain regions 140 may be made of the same material as the first multi-channel active pattern 105 or a tensile stress material. For example, if the first multi-channel active pattern 105 is made of Si, the first source/drain regions 140 may be made of Si or a material (e.g., SiC) having a smaller lattice constant than Si.

Further, although not illustrated in FIGS. 1 through 4, a seed layer may be formed between the first source/drain regions 140 and the second portions 105b of the first multi-channel active pattern 105. Here, the seed layer may be a layer included in each of the first source/drain regions 140.

In addition, although not illustrated in FIGS. 1, 3 and 4, in semiconductor devices according to embodiments of the present invention, each of the source/drain regions 140 may further include a metal silicide layer formed thereon.

The effects of the semiconductor device 1 according to the first embodiment of the present invention will now be described with reference to FIG. 5.

The following assumptions will be made before the effects of the semiconductor device 1 according to the first embodiment of the present invention are described. First, it will be assumed that a height from the substrate 100 to a topmost surface of the first source/drain region 140 is equal to a height from the substrate 100 to a topmost surface of a reference source/drain region 140r. In addition, unlike the illustration of FIG. 1, it will be assumed for ease of description that the topmost surface of the first source/drain region 140 and the topmost surface of the reference source/drain region 140r have the same crystal face as the substrate 100.

It will also be assumed that a height from the substrate 100 to a top surface of the first multi-channel active pattern 105 is substantially equal to a height from the substrate 100 to a top surface of a reference multi-channel active pattern 105r.

In addition, it will be assumed that the substrate 100 has been fabricated using a silicon substrate having a (100) crystal surface and that the first multi-channel active pattern 105 and the reference multi-channel active pattern 105r have been fabricated using part of the substrate 100. Further, it will be assumed that the first source/drain region 140 and the reference source/drain region 140r contain silicon germanium (SiGe).

Referring to FIG. 5, in the semiconductor device 1 (illustrated on the left side) according to the first embodiment of the present invention, the first multi-channel active pattern 105 protrudes further upward than the top surface 103u of the field insulating layer 103. Here, a height by which the first multi-channel active pattern 105 protrudes further upward than the field insulating layer 103 is b. In addition, a width of the first source/drain region 140 formed on the first multi-channel active pattern 105 is w1.

On the other hand, in a comparative semiconductor device (illustrated on the right side), the reference multi-channel active pattern 105r does not protrude further upward than a top surface of a reference field insulating layer 103r. That is, the top surface of the reference multi-channel active pattern 105r and the top surface of the reference field insulating layer 103r lie in substantially the same plane. In addition, a width of the reference source/drain region 140r formed on the reference multi-channel active pattern 105r is w2.

An angle formed by each side surface of the reference source/drain region 140r grown from the top surface of the reference multi-channel active pattern 105r and the top surface of the reference field insulating layer 103r is a. For example, since the top surface of the reference multi-channel active pattern 105r is the same as the crystal face of the substrate 100, it has the (100) crystal face. However, each side surface of the reference source/drain region 140r formed by the lateral growth of the reference source/drain region 140r has a {111} crystal face group. That is, the angle a formed by the top surface of the reference multi-channel active pattern 105r and each side surface of the reference source/drain 140r is approximately 54.7 degrees.

As in the comparative semiconductor device, in the semiconductor device 1 according to the first embodiment of the present invention, an angle a formed by each side surface of the first source/drain region 140 grown from the top and side surfaces of the first multi-channel active pattern 105 and the top surface 103u of the field insulating layer 103 is approximately 54.7 degrees.

The reference source/drain region 140r of the comparative semiconductor device grows only from the top surface of the reference multi-channel active pattern 105r. On the other hand, the first source/drain region 140 of the semiconductor device 1 according to the first embodiment of the present invention grow not only from the top surface of the protruding first multi-channel active pattern 105 but also from the side surfaces of the first multi-channel active pattern 105. That is, a point at which the first source/drain region 140 begins to grow epitaxially is lower than a point at which the reference source/drain region 140r begins to grow epitaxially by b.

Therefore, the first source/drain region 140 grows laterally more than the reference source/drain region 140r due to the first multi-channel active pattern 105 which protrudes further upward than the top surface 103u of the field insulating layer 103. More specifically, the first source/drain region 140 grows laterally more than the reference source/drain region 140r by 2×c.

The amount of additional lateral growth can be calculated as follows. Geometrically, the height b of the first multi-channel active pattern 105 which protrudes further than the field insulating layer 103 and the amount c of additional lateral growth of the first source/drain region 140 satisfy the relation of tan(a)=b÷c. That is, b÷c=tan(54.7°)≈1.4.

Therefore, the amount of additional lateral growth of the first source/drain region 140 is given by 2×c=2×b÷1.4. In conclusion, the width w1 of the first source/drain region 140 and the width w2 of the reference source/drain region 140r satisfy the relation of w1=w2+2×b÷1.4.

In the semiconductor device 1 according to the first embodiment of the present invention, since the first multi-channel active pattern 105 protrudes further upward than the field insulating layer 103, the first source/drain region 140 is wider than the reference source/drain region 140r. Accordingly, the first source/drain region 140 has a greater volume than the reference source/drain region 140r. The first source/drain region 140 having a greater volume than the reference source/drain region 140r reduces contact resistance with a contact formed on the first source/drain region 140, thereby improving element characteristics.

FIGS. 6 through 7B are cross-sectional views of modified examples of the semiconductor device 1 according to the first embodiment of the present invention. Specifically, FIG. 6 is a cross-sectional view taken along the line A-A of FIG. 1. FIGS. 7A and 7B are cross-sectional views taken along the line C-C of FIG. 1. For simplicity, the modified examples will be described, focusing mainly on differences with the first embodiment described above with reference to FIGS. 1 through 4.

Referring to FIG. 6, in a modified example of the semiconductor device 1 according to the first embodiment of the present invention, a first portion 105a of a first multi-channel active pattern 105 includes a nanowire.

The nanowire illustrated in the drawing has a circular cross section. However, the present invention is not limited thereto. That is, the nanowire can also have a quadrilateral cross section. In addition, while one nanowire is illustrated in the drawing, this is merely an example, and the present invention is not limited to this example.

A first gate insulating layer 110 may be formed not only on a top surface 103u of a field insulating layer 103 but also entirely surround the first portion 105a of the first multi-channel active pattern 105. In addition, a first metal layer 122 of a first gate electrode 120 may be formed not only on the first gate insulating layer 110 but also entirely surround the first portion 105a of the first multi-channel active pattern 105 having the first gate insulating layer 110.

A second metal layer 124 of the first gate electrode 120 may fill the space left after the first gate insulating layer 110 and the first metal layer 122 are formed. That is, the second metal layer 124 fills the space between the field insulating layer 103 and the first portion 105a of the first multi-channel active pattern 105.

Referring to FIG. 7A, in the modified example of the semiconductor device 1 according to the first embodiment of the present invention, an outer circumferential surface of a first source/drain region 140 may be circular.

Referring to FIG. 7B, in another modified example of the semiconductor device 1 according to the first embodiment of the present invention, an outer circumferential surface of a first source/drain region 140 may be rectangular. The first source/drain region 140 having the rectangular outer circumferential surface may contact a field insulating layer 103 along a top surface 103u of the field insulating layer 103, but the present invention is not limited thereto.

The following embodiments will be described based on the assumption that the outer circumferential surface of the first source/drain region 140 is diamond-shaped.

A semiconductor device according to a second embodiment of the present invention will now be described with reference to FIGS. 8 and 9. For simplicity, the second embodiment will be described, focusing mainly on differences with the first embodiment described above with reference to FIGS. 1 through 4.

FIG. 8 is a perspective view of a semiconductor device 2 according to a second embodiment of the present invention. FIG. 9 is a cross-sectional view taken along the line C-C of FIG. 8.

Referring to FIGS. 8 and 9, in the semiconductor device 2 according to the second embodiment of the present invention, first source/drain regions 140 contact a field insulating layer 103 along a top surface 103u of the field insulating layer 103.

Specifically, each of the first source/drain regions 140 is formed on a top surface 105b-1 and sidewalls 105b-2 of a second portion 105b of a first multi-channel active pattern 105 which protrudes further upward than the top surface 103u of the field insulating layer 103 and on the top surface 103u of the field insulating layer 103.

Therefore, each of the first source/drain regions 140 contacts not only the second portion 105b of the first multi-channel active pattern 105 which protrudes further upward than the top surface 103u of the field insulating layer 103 but also part of the top surface 103u of the field insulating layer 103. The first source/drain regions 140 may grow laterally along the top surface 103u of the field insulating layer 103 adjacent to the first source/drain regions 140. Therefore, respective surfaces of the first source/drain regions 140 which correspond to the field insulating layer 103 may extend along the top surface 103u of the field insulating layer 103.

An inner circumferential surface of each of the first source/drain regions 140 contacts the second portion 105b of the first multi-channel active pattern 105 and is formed along the top surface 105b-1 and the sidewalls 105b-2 of the second portion 105b of the first multi-channel active pattern 105 which protrudes further upward than the top surface 103u of the field insulating layer 103 and along the top surface 103u of the field insulating layer 103.

Compared with the first source/drain regions 140 of the semiconductor device 1 according to the first embodiment, the first source/drain regions 140 of the semiconductor device 2 according to the second embodiment of the present invention contact a larger area of the field insulating layer 103.

A semiconductor device according to a third embodiment of the present invention will now be described with reference to FIGS. 10 and 11. For simplicity, the third embodiment will be described, focusing mainly on differences with the first embodiment described above with reference to FIGS. 1 through 4.

FIG. 10 is a perspective view of a semiconductor device 3 according to a third embodiment of the present invention. FIG. 11 is a cross-sectional view taken along the line C-C of FIG. 10.

Referring to FIGS. 10 and 11, the semiconductor device 3 according to the third embodiment of the present invention further includes first fin spacers 135.

The first fin spacers 135 are formed on part of sidewalls 105b-2 of a second portion 105b of a first multi-channel active pattern 105 which protrudes further upward than a top surface 103u of a field insulating layer 103. Therefore, part of the second portion 105b of the first multi-channel active pattern 105 protrudes further upward than the first fin spacers 135. That is, part of the sidewalls 105b-2 of the second portion 105b of the first multi-channel active pattern 105 is not covered by the first fin spacers 135.

Since the first fin spacers 135 are formed on the sidewalls 105b-2 of the second portion 105b of the protruding first multi-channel active pattern 105, they extend along a first direction X1. Each of the first fin spacers 135 includes an inner side surface 135a which is adjacent to the second portion 105b of the first multi-channel active pattern 105 and an outer side surface 135b which faces the inner side surface 135a.

The first fin spacers 135 are physically connected to first gate spacers 130 formed on sidewalls of a first gate electrode 120. The first fin spacers 135 and the first gate spacers 130 are connected to each other because they are formed at the same level. Here, the term "the same level" denotes that the first fin spacers 135 and the first gate spaces 130 are formed by the same fabrication process.

The first fin spacers 135 may include at least one of SiN, SiON, $SiO_2$, SiOCN, and combinations of the same. In the drawings, each of the first fin spacers 135 is illustrated as a single layer. However, the present invention is not limited thereto, and each of the first fin spacers 135 can also have a multilayer structure.

First source/drain regions 140 partially surround the first fin spacers 135. In addition, each of the first source/drain regions 140 is formed to contact a top surface 105b-1 and the sidewalls 105b-2 of the second portion 105b of the first multi-channel active pattern 105 which protrudes further upward than the first fin spacers 135.

The first source/drain regions 140 contact the first fin spacers 135 along the outer side surfaces 135b of the first fin spacers 135. Since the first source/drain regions 140 partially cover the first fin spacers 135, they extend along part of the outer side surfaces 135b of the first fin spacers 135. That is, upper parts of the outer side surfaces 135b of the first fin spacers 135 contact the first source/drain regions 140, and lower parts of the outer side surfaces 135b of the first fin spacers 135 do not contact the first source/drain regions 140.

An inner circumferential surface of each of the first source/drain regions 140 contacts the second portion 105b of the first multi-channel active pattern 105 and is formed along the top surface 105b-1 and the sidewalls 105b-2 of the second portion 105b of the first multi-channel active pattern 105 which protrudes further upward than the first fin spacers 135 and along part of the outer side surfaces 135b of the first fin spacers 135.

In the semiconductor device 3 according to the third embodiment of the present invention, the first source/drain regions 140 do not contact the field insulating layer 103. That is, the first source/drain regions 140 are separated from the field insulating layer 103.

A semiconductor device according to a fourth embodiment of the present invention will now be described with reference to FIGS. 12 and 13. For simplicity, the fourth embodiment will be described, focusing mainly on differences with the third embodiment described above with reference to FIGS. 10 and 11.

FIG. 12 is a perspective view of a semiconductor device 4 according to a fourth embodiment of the present invention. FIG. 13 is a cross-sectional view taken along the line C-C of FIG. 12.

Referring to FIGS. 12 and 13, in the semiconductor device 4 according to the fourth embodiment of the present invention, first source/drain regions 140 entirely cover first fin spacers 135.

Specifically, the first source/drain regions 140 entirely cover outer side surfaces 135b of the first fin spacers 135. Therefore, the first source/drain regions 140 may contact a field insulating layer 103.

In addition, the first source/drain regions 140 contact the field insulating layer 103 along a top surface 103u of the field insulating layer 103. That is, the first source/drain regions 140 entirely covering the first fin spacers 135 may grow laterally along the top surface 103u of the field insulating layer 103 which is adjacent to the outer side surfaces 135b of the first fin spacers 135. Therefore, surfaces of the first source/drain regions 140 which correspond to the top surface 103u of the field insulating layer 103 extend along the top surface 103u of the field insulating layer 103.

An inner circumferential surface of each of the first source/drain regions 140 contacts a second portion 105b of a first multi-channel active pattern 105 and is formed along a top surface 105b-1 and sidewalls 105b-2 of the second portion 105b of the first multi-channel active pattern 105 which protrudes further upward than the first fin spacers 135 and along the top surface 103u of the field insulating layer 103.

In FIGS. 12 and 13, the first source/drain regions 140 extend along the top surface 103u of the field insulating layer 103. However, the present invention is not limited thereto. That is, a bottommost part of each of the first source/drain regions 140 is formed only in an upward direction Z1 along a boundary between the field insulating layer 103 and the outer side surfaces 135b of the first fin spacers 135. Further, while the bottommost parts of the first source/drain regions 140 contact the top surface 103u of the field insulating layer 103, they may not grow laterally along the top surface 103u of the field insulating layer 103.

A semiconductor device according to a fifth embodiment of the present invention will now be described with reference to FIGS. 14 through 16. For simplicity, the fifth embodiment will be described, focusing mainly on differences with the first embodiment described above with reference to FIGS. 1 through 4.

FIG. 14 is a perspective view of a semiconductor device 5 according to a fifth embodiment of the present invention. FIG. 15 is a cross-sectional view taken along the lines B1-B1 and B2-B2 of FIG. 14. FIG. 16 is a cross-sectional view taken along the line C-C of FIG. 14.

Referring to FIGS. 14 through 16, in the semiconductor device 5 according to the fifth embodiment of the present invention, a first multi-channel active pattern 105 and a fifth multi-channel active pattern 505 may be formed on a substrate 100 to extend along a first direction X1. The first multi-channel active pattern 105 and the fifth multi-channel active pattern 505 are formed adjacent to each other with a field insulating layer 103 interposed therebetween.

The fifth multi-channel active pattern 505 protrudes further upward than the field insulating layer 103 formed on the substrate 100. Like the first multi-channel active pattern 105, the fifth multi-channel active pattern 505 is defined by the field insulating layer 103.

The fifth multi-channel active pattern 505 includes a first portion 505a and a second portion 505b. The second portion 505b of the fifth multi-channel active pattern 505 is disposed on both sides of the first portion 505a of the fifth multi-channel active pattern 505 in the first direction X1.

A top surface 505b-1 of the second portion 505b of the fifth multi-channel active pattern 505 and a top surface 505a-1 of the first portion 505a of the fifth multi-channel active pattern 505 protrude further upward than a top surface 103u of the field insulating layer 103. That is, the first portion 505a of the fifth multi-channel active pattern 505 and the second portion 505b of the fifth multi-channel active pattern 505 protrude further upward than the field insulating layer 103. The second portion 505b of the fifth multi-channel active pattern 505 is more recessed than the first portion 505a of the fifth multi-channel active pattern 505.

A first gate electrode 120 may extend along a second direction Y1 to intersect the first multi-channel active pattern 105 and the fifth multi-channel active pattern 505. The first gate electrode 120 may be formed on the first multi-channel active pattern 105, the fifth multi-channel active pattern 505, and the field insulating layer 103. The first gate electrode 120 is formed on a first portion 105a of the first multi-channel active pattern 105 and the first portion 505a of the fifth multi-channel active pattern 505.

Fifth source/drain regions 540 are formed on the fifth multi-channel active pattern 505 on both sides of the first gate electrode 120. In other words, each of the fifth source/drain regions 540 is formed on the second portion 505b of the fifth multi-channel active pattern 505. An outer circumferential surface of each of the fifth source/drain regions 540 may have various shapes. For example, the outer circumferential surface of each of the fifth source/drain regions 540 may have at least one of a diamond shape, a circular shape, and a rectangular shape. In FIG. 14, the diamond shape (or a pentagonal shape or a hexagonal shape) is illustrated, but the present invention is not limited thereto.

Each of the fifth source/drain regions 540 is formed around the second portion 505b of the fifth multi-channel active pattern 505 which protrudes further upward than the top surface 103u of the field insulating layer 103. More specifically, each of the fifth source/drain regions 540 is formed on the top surface 505b-1 and sidewalls 505b-2 of the second portion 505b of the fifth multi-channel active pattern 505 which protrudes further upward than the top surface 103u of the field insulating layer 103.

The whole of the second portion 505b of the fifth multi-channel active pattern 505 which protrudes further upward than the top surface 103u of the field insulating layer 103 directly contacts each of the fifth source/drain regions 540. In addition, the fifth source/drain regions 540 contact the field insulating layer 103.

The fifth source/drain regions 540 may have the same conductivity type as first source/drain regions 140. In addition, the fifth source/drain regions 540 may include the same material as the first source/drain regions 140.

In the semiconductor device 5 according to the fifth embodiment of the present invention, the fifth source/drain regions 540 may contact and be connected to the first source/drain regions 140. That is, the fifth source/drain regions 540 may be electrically connected to the first source/drain regions 140.

Since the first source/drain regions 140 contact the fifth source/drain regions 540, an interlayer insulating layer 150 may not be formed between the first source/drain regions 140 and the fifth source/drain regions 540. Accordingly, an air gap 145 may be formed.

As in the fifth embodiment of the present invention, after a plurality of multi-channel active patterns are partially exposed, if source/drain regions are formed on each of the multi-channel active patterns, the following effects can be obtained.

That is, after part of side surfaces of each of a plurality of multi-channel active patterns and a top surface of each of the multi-channel active patterns are exposed, if source/drain regions are formed on the exposed side and top surfaces of each of the multi-channel active patterns, the size controllability of each of the source/drain regions can be improved. In other words, the source/drain regions disposed adjacent to each other can grow to a uniform size.

FIG. 17 is a cross-sectional view of a semiconductor device 6 according to a sixth embodiment of the present invention. For simplicity, the sixth embodiment will be described, focusing mainly on differences with the fifth embodiment described above with reference to FIGS. 14 through 16.

Referring to FIG. 17, in the semiconductor device 6 according to the sixth embodiment of the present invention, a first source/drain region 140 and a fifth source/drain region 540 contact a field insulating layer 103 along a top surface 103u of the field insulating layer 103.

The first source/drain region 140 contacts not only a second portion 105b of a first multi-channel active pattern 105 which protrudes further upward than the top surface 103u of the field insulating layer 103 but also part of the top surface 103u of the field insulating layer 103. Like the first source/drain region 140, the fifth source/drain region 540 contacts not only a second portion 505b of a fifth multi-channel active pattern 505 which protrudes further upward than the field insulating layer 103 but also part of the top surface 103u of the field insulating layer 103. A surface of the first source/drain region 140 and a surface of the fifth source/drain region 540 which correspond to the field insulating layer 103 extend along the top surface 103u of the field insulating layer 103.

FIG. 18 is a cross-sectional view of a semiconductor device 7 according to a seventh embodiment of the present invention. For simplicity, the seventh embodiment will be described, focusing mainly on differences with the third and fifth embodiments described above with reference to FIGS. 10, 11 and 14 through 16.

Referring to FIG. 18, the semiconductor device 7 according to the seventh embodiment of the present invention further includes first fin spacers 135 and fifth fin spacers 535.

The first fin spacers 135 are formed on part of sidewalls 105b-2 of a second portion 105b of a first multi-channel active pattern 105 which protrudes further upward than a top surface 103u of a field insulating layer 103. Thus, part of the second portion 105b of the first multi-channel active pattern 105 protrudes further upward than the first fin spacers 135. The fifth fin spacers 535 are formed on part of sidewalls 505b-2 of a second portion 505b of a fifth multi-channel active pattern 505 which protrudes further upward than the top surface 103u of the field insulating layer 103. Thus, part of the second portion 505b of the fifth multi-channel active pattern 505 protrudes further upward than the fifth fin spacers 535.

The first fin spacers 135 and the fifth fin spacers 535 extend along a first direction X1. In addition, the first fin spacers 135 and the fifth fin spacers 535 are formed at the same level.

A first source/drain region 140 is formed along part of the first fin spacers 135 and around the second portion 105b of the first multi-channel active pattern 105 which protrudes further upward than the first fin spacers 135. A fifth source/drain regions 540 is formed along part of the fifth fin spacers 535 and around the second portion 505b of the fifth multi-channel active pattern 505 which protrudes further upward than the fifth fin spacers 535.

In the semiconductor device 7 according to the seventh embodiment of the present invention, the first source/drain region 140 and the fifth source/drain region 540 contact each other. However, the first source/drain region 140 and the fifth source/drain region 540 are separated from the field insulating layer 103.

In the cross-sectional view, an air gap 145 formed between the first source/drain region 140 and the fifth source/drain region 540 may be surrounded by the field insulating layer 103, the first fin spacer 135, the fifth fin spacer 535, the first source/drain region 140, and the fifth source/drain region 540.

FIG. 19 is a cross-sectional view of a semiconductor device 8 according to an eighth embodiment of the present invention. For simplicity, the eighth embodiment will be described, focusing mainly on differences with the seventh embodiment described above with reference to FIG. 18.

Referring to FIG. 19, in the semiconductor device 8 according to the eighth embodiment of the present invention, a first source/drain region 140 entirely covers first fin spacers 135, and a fifth source/drain region 540 entirely covers fifth fin spacers 535.

Therefore, the first source/drain region 140 and the fifth source/drain region 540 may contact a field insulating layer 103. In FIG. 19, the first source/drain region 140 and the fifth source/drain region 540 are grown laterally such that a surface of the first source/drain region 140 and a surface of the fifth source/drain region 540 which correspond to a top surface 103u of the field insulating layer 103 extend along the top surface 103u of the field insulating layer 103, but the present invention is not limited thereto. That is, a bottommost part of the first source/drain region 140 may be formed only in an upward direction Z1 along a boundary between the field insulating layer 103 and the first fin spacers 135. Further, the bottommost part of the first source/drain region 140 contacts the top surface 103u of the field insulating layer 103 but may not grow laterally along the top surface 103u of the field insulating layer 103. Like the first source/drain region 140, the fifth source/drain region 540 contacts the top surface 103u of the field insulating layer 103 but may not grow laterally along the top surface 103u of the field insulating layer 103.

A semiconductor device according to a ninth embodiment of the present invention will now be described with reference to FIGS. 20 and 21.

FIG. 20 is a perspective view of a semiconductor device 9 according to a ninth embodiment of the present invention. FIG. 21 is a cross-sectional view taken along the lines C-C and D-D of FIG. 20.

Referring to FIGS. 20 and 21, the semiconductor device 9 according to the ninth embodiment of the present invention may include a substrate 100, a second multi-channel active pattern 205, a third multi-channel active pattern 305, a second gate electrode 220, a third gate electrode 320, second source/drain regions 240, third source/drain regions 340, etc.

The substrate 100 may include a first region I and a second region II. The first region I and the second region II may be separated from each other or may be connected to each other. The first region I may include a P-type transistor region, and the second region II may include an N-type transistor region. That is, a first transistor 201 may be a P-type transistor, and a second transistor 301 may be an N-type transistor. Therefore, the first transistor 201 is formed in the first region I, and the second transistor 301 is formed in the second region II.

The first transistor 201 includes the second multi-channel active pattern 205, the second gate electrode 220, and the second source/drain regions 240.

The second multi-channel active pattern 205 may be defined by a field insulating layer 103 and extend along a third direction X2. Like the illustration of FIG. 3, the second multi-channel active pattern 205 includes a first portion 205a and a second portion 205b. The second portion 205b of the second multi-channel active pattern 205 is disposed on both sides of the first portion 205a of the second multi-channel active pattern 205 in the third direction X2.

A top surface 205b-1 of the second portion 205b of the second multi-channel active pattern 205 and a top surface 205a-1 of the first portion 205a of the second multi-channel active pattern 205 may protrude further upward than a top surface 103u of the field insulating layer 103. That is, the first portion 205a of the second multi-channel active pattern 205 and the second portion 205b of the second multi-channel active pattern 205 may protrude further upward than the field insulating layer 103. The second portion 205b of the second multi-channel active pattern 205 is more recessed than the first portion 205a of the second multi-channel active pattern 205.

The profile of sidewalls of the second portion 205b of the second multi-channel active pattern 205 is continuous. Specifically, the second portion 205b of the second multi-channel active pattern 205 includes a portion which contacts the field insulating layer 103 and a portion which protrudes further upward than the field insulating layer 103 without contacting the field insulating layer 103. Here, the profile of sidewalls of the second portion 205b of the second multi-channel active pattern 205 which contacts the field insulating layer 103 is continuous with the profile of sidewalls 205b-2 of the second portion 205b of the second multi-channel active pattern 205 which protrudes further upward than the field insulating layer 103.

The second gate electrode 220 may extend along a fourth direction Y2 and intersect the second multi-channel active pattern 205. The second gate electrode 220 may be formed on the second multi-channel active pattern 205, more specifically, the first portion 205a of the second multi-channel active pattern 205. The second gate electrode 220 may include metal layers (222, 224). As illustrated in the drawings, the second gate electrode 220 may be a stack of two or more metal layers (222, 224). The second gate electrode 220 may include a material included in the first gate electrode 120 described above with reference to FIGS. 1 through 4.

The second source/drain regions 240 are formed on the second multi-channel active pattern 205 on both sides of the second gate electrode 220. In other words, each of the second source/drain regions 240 is formed on the second portion 205b of the second multi-channel active pattern 205.

Each of the second source/drain regions 240 is formed around the second portion 205b of the second multi-channel active pattern 205 which protrudes further upward than the top surface 103u of the field insulating layer 103. More specifically, each of the second source/drain regions 240 is formed on the top surface 205b-1 and the sidewalls 205b-2 of the second portion 205b of the second multi-channel active pattern 205 which protrudes further upward than the top surface 103u of the field insulating layer 103.

The whole of the second portion 205b of the second multi-channel active pattern 205 which protrudes further upward than the top surface 103u of the field insulating layer 103 contacts each of the second source/drain regions 240. In addition, the second source/drain regions 240 contact the field insulating layer 103.

The second transistor 301 includes the third multi-channel active pattern 305, the third gate electrode 320, and the third source/drain regions 340.

The third multi-channel active pattern 305 may be defined by the field insulating layer 103 and extend along a fifth direction X3. Like the illustration of FIG. 3, the third multi-channel active pattern 305 includes a first portion 305a and a second portion 305b. The second portion 305b of the third multi-channel active pattern 305 is disposed on both sides of the first portion 305a of the third multi-channel active pattern 305 in the fifth direction X3.

A top surface 305b-1 of the second portion 305b of the third multi-channel active pattern 305 and a top surface 305a-1 of the first portion 305a of the third multi-channel active pattern 305 may protrude further upward than the top surface 103u of the field insulating layer 103. Further, the second portion 305b of the third multi-channel active pattern 305 is more recessed than the first portion 305a of the third multi-channel active pattern 305.

The profile of sidewalls of the second portion 305b of the third multi-channel active pattern 305 is continuous. Specifically, the second portion 305b of the third multi-channel active pattern 305 includes a portion which contacts the field insulating layer 103 and a portion which protrudes further upward than the field insulating layer 103 without contacting the field insulating layer 103. Here, the profile of sidewalls of the second portion 305b of the third multi-channel active pattern 305 which contacts the field insulating layer 103 is continuous with the profile of sidewalls 305b-2 of the second portion 305b of the third multi-channel active pattern 305 which protrudes further upward than the field insulating layer 103.

The third gate electrode 320 may extend along a sixth direction Y3 and intersect the third multi-channel active pattern 305. The third gate electrode 320 may be formed on the first portion 305a of the third multi-channel active pattern 305. The third gate electrode 320 may include metal layers (322, 324). As illustrated in the drawings, the third gate electrode 320 may be a stack of two or more metal layers (322, 324). The third gate electrode 320 may include a material included in the first gate electrode 120 described above with reference to FIGS. 1 through 4.

The third source/drain regions 340 are formed on the third multi-channel active pattern 305 on both sides of the third gate electrode 320. In other words, each of the third source/drain regions 340 is formed on the second portion 305b of the third multi-channel active pattern 305.

Each of the third source/drain regions 340 is formed around the second portion 305b of the third multi-channel active pattern 305 which protrudes further upward than the top surface 103u of the field insulating layer 103. More specifically, each of the third source/drain regions 340 is formed on the top surface 305b-1 and the sidewalls 305b-2 of the second portion 305b of the third multi-channel active pattern 305 which protrudes further upward than the top surface 103u of the field insulating layer 103.

The whole of the second portion 305b of the third multi-channel active pattern 305 which protrudes further upward than the top surface 103u of the field insulating layer 103 contacts each of the third source/drain regions 340. In addition, the third source/drain regions 340 contact the field insulating layer 103.

In the semiconductor device 9 according to the ninth embodiment of the present invention, the second source/drain regions 240 which contact the field insulating layer 103 are formed higher (in an upward direction Z2) than a boundary between the second multi-channel active pattern 205 and the field insulating layer 103. That is, a bottommost part of each of the source/drain regions 240 is formed along the boundary between the field insulating layer 103 and the second multi-channel active pattern 205. Further, the third source/drain regions 340 which contact the field insulating layer 103 are formed higher (in an upward direction Z3) than a boundary between the third multi-channel active pattern 305 and the field insulating layer 103. That is, a bottommost part of each of the third source/drain regions 340 is formed along the boundary between the field insulating layer 103 and the third multi-channel active pattern 305.

FIG. 22 is a perspective view of a semiconductor device 10 according to a tenth embodiment of the present invention. FIG. 23 is a cross-sectional view taken along the lines C-C and D-D of FIG. 22. For simplicity, the tenth embodiment will be described, focusing mainly on differences with the ninth embodiment described above with reference to FIGS. 20 and 21.

Referring to FIGS. 22 and 23, in the semiconductor device 10 according to the tenth embodiment of the present invention, third source/drain regions 340 contact a field insulating layer 103 along a top surface 103u of the field insulating layer 103.

Each of the third source/drain regions 340 contacts not only a second portion 305b of a third multi-channel active pattern 305 which protrudes further upward than the top surface 103u of the field insulating layer 103 but also part of the top surface 103u of the field insulating layer 103. Surfaces of the third source/drain regions 340 which correspond to the field insulating layer 103 extend along the top surface 103u of the field insulating layer 103. That is, bottommost surfaces of the third source/drain regions 340 may be formed by lateral growth of the third source/drain regions 340 along part of the top surface 103u of the field insulating layer 103.

On the other hand, bottommost parts of second source/drain regions 240 are formed along a boundary between the field insulating layer 103 and a second multi-channel active pattern 205. That is, the bottommost parts of the second source/drain regions 240 do not grow laterally along the top surface 103u of the field insulating layer 103.

Therefore, in the semiconductor device 10 according to the tenth embodiment of the present invention, the area of a first region in which the second source/drain regions 240 contact the field insulating layer 103 is different from the area of a second region in which the third source/drain regions 340 contact the field insulating layer 103. For example, the area of the second region in which the third source/drain regions 340 contact the field insulating layer 103 is greater than the area of the first region in which the second source/drain regions 240 contact the field insulating layer 103. This difference in contact area varies according to whether the second source/drain regions 240 and the third source/drain regions 340 grow laterally along the top surface 103u of the field insulating layer 103.

FIG. 24 is a perspective view of a semiconductor device 11 according to an eleventh embodiment of the present invention. FIG. 25 is a cross-sectional view taken along the lines C-C and D-D of FIG. 24. For simplicity, the eleventh embodiment will be described, focusing mainly on differences with the ninth embodiment described above with reference to FIGS. 20 and 21.

Referring to FIGS. 24 and 25, in the semiconductor device 11 according to the eleventh embodiment of the present invention, a first transistor 201 further includes second fin spacers 235, and a second transistor 301 further includes third fin spacers 335.

In the first transistor 201, the second fin spacers 235 are formed on part of sidewalls 205b-2 of a second portion 205b of a second multi-channel active pattern 205 which protrudes further upward than a top surface 103u of a field insulating layer 103. Therefore, part of the second portion 205b of the second multi-channel active pattern 205 protrudes further upward than the second fin spacers 235.

The second fin spacers 235 and second gate spacers 230 are formed at the same level and are connected to each other.

Second source/drain regions 240 are formed on a top surface 205b-1 and the sidewalls 205b-2 of the second portion 205b of the second multi-channel active pattern 205 which protrudes further than the second fin spacers 235. Each of the second source/drain regions 240 is formed around the second portion 205b of the second multi-channel active pattern 205 which protrudes further upward than the second fin spacers 235 to contact the second portion 205b.

In the semiconductor device 11 according to the eleventh embodiment of the present invention, bottommost parts 240b of the second source/drain regions 240 may be formed along topmost parts 235t of the second fin spacers 235. That is, the second source/drain regions 240 may not extend along outer side surfaces of the second fin spacers 235.

In the second transistor 301, the third fin spacers 335 are formed on part of sidewalls 305b-2 of a second portion 305b of a third multi-channel active pattern 305 which protrudes further upward than the top surface 103u of the field insulating layer 103. Therefore, part of the second portion 305b of the third multi-channel active pattern 305 protrudes further upward than the third fin spacers 335.

The third fin spacers 335 and third gate spacers 330 are formed at the same level and are connected to each other.

In the second transistor 301, third source/drain regions 304 partially cover the third fin spacers 335. In addition, the third source/drain regions 340 are formed to contact a top surface 305b-1 and the sidewalls 305b-2 of the second portion 305b of the third multi-channel active pattern 305 which protrudes further upward than the third fin spacers 335. The third source/drain regions 340 are formed around the second portion 305b of the third multi-channel active pattern 305 which protrudes further upward than the third fin spacers 335 to contact the second portion 305b.

The third source/drain regions 340 contact the third fin spacers 335 along outer side surfaces of the third fin spacers 335. Since the third source/drain regions 340 partially cover the third fin spacers 335, they extend along part of the outer side surfaces of the third fin spacers 335.

In the semiconductor device 11 according to the eleventh embodiment of the present invention, the second source/drain regions 240 and the third source/drain regions are separated from the field insulating layer 103 without contacting the field insulating layer 103. Assuming that a height from the top surface 103u of the field insulating layer 103 to the topmost parts 235t of the second fin spacers 235 is equal to a height from the top surface 103u of the field insulating layer 103 to topmost parts of the third fin spacers 335, a vertical gap between the second source/drain regions 240 and the field insulating layer 103 is greater than a vertical gap between the third source/drain regions 340 and the field insulating layer 103.

FIG. 26 is a perspective view of a semiconductor device 12 according to a twelfth embodiment of the present invention. FIG. 27 is a cross-sectional view taken along the lines C-C and D-D of FIG. 26. For simplicity, the twelfth embodiment will be described, focusing mainly on differences with the eleventh embodiment described above with reference to FIGS. 24 and 25.

Referring to FIGS. 26 and 27, in the semiconductor device 12 according to the twelfth embodiment of the present invention, third source/drain regions 340 may entirely cover third fin spacers 335 and contact a field insulating layer 103.

In FIG. 27, in a second transistor 301, the third source/drain regions 340 are grown laterally such that surfaces of the third source/drain regions 340 which correspond to a top surface 103$u$ of the field insulating layer 103 extend along the top surface 103$u$ of the field insulating layer 103, but the present invention is not limited thereto. That is, bottommost parts of the third source/drain regions 340 may contact the top surface 103$u$ of the field insulating layer 103 but may not grow laterally along the top surface 103$u$ of the field insulating layer 103.

A semiconductor device according to a thirteenth embodiment of the present invention will now be described with reference to FIGS. 28 through 30.

FIG. 28 is a perspective view of a semiconductor device 13 according to a thirteenth embodiment of the present invention. FIG. 29 is a cross-sectional view taken along the lines C-C and D-D of FIG. 28. FIG. 30 is a cross-sectional view taken along the line E-E of FIG. 28.

More specifically, a third transistor 101 formed in a third region III of FIG. 28 may be one of the semiconductor devices 1 and 2 according to the first and second embodiments of the present invention. A case where the third transistor 101 formed in the third region III is the semiconductor device 1 according to the first embodiment of the present invention will be described below as an example.

Referring to FIGS. 28 through 30, the semiconductor device 13 according to the thirteenth embodiment of the present invention may include a substrate 100, a first multi-channel active pattern 105, a fourth multi-channel active pattern 405, a first gate electrode 120, a fourth gate electrode 420, first source/drain regions 140, fourth source/drain regions 440, etc.

The substrate 100 may include the third region III and a fourth region IV. The third region III and the fourth region IV may be separated from each other or may be connected to each other. In addition, the third region III and the fourth region IV may include transistor regions of different types or the same type.

The third transistor 101 includes the first multi-channel active pattern 105, the first gate electrode 120, and the first source/drain regions 140. Since the third transistor 101 has been described above with reference to FIGS. 1 through 4, a repetitive description thereof will be omitted.

A fourth transistor 401 includes the fourth multi-channel active pattern 405, the fourth gate electrode 420, and the fourth source/drain regions 440.

The fourth multi-channel active pattern 405 may be defined by a field insulating layer 103 and extend along a seventh direction X4. The fourth multi-channel active pattern 405 includes a first portion 405$a$ and a second portion 405$b$. The second portion 405$b$ of the fourth multi-channel active pattern 405 is disposed on both sides of the first portion 405$a$ of the fourth multi-channel active pattern 405 in the seventh direction X4.

A top surface 405$a$-1 of the first portion 405$a$ of the fourth multi-channel active pattern 405 protrudes further upward than a top surface 103$u$ of the field insulating layer 103. However, a top surface 405$b$-1 of the second portion 405$b$ of the fourth multi-channel active pattern 405 does not protrude further upward than the top surface 103$u$ of the field insulating layer 103.

For ease of description, the top surface 103$u$ of the field insulating layer 103 is illustrated in the drawings as being flat, and the top surface 405$b$-1 of the second portion 405$b$ of the fourth multi-channel active pattern 405 is illustrated in the drawings as lying in the same plane with the top surface 103$u$ of the field insulating layer 103.

However, if the top surface 103$u$ of the field insulating layer 103 is not flat, a distance from the substrate 100 to a boundary line between the field insulating layer 103 and the fourth multi-channel active pattern 405 is substantially equal to a height of the top surface 405$b$-1 of the second portion 405$b$ of the fourth multi-channel active pattern 405.

The fourth gate electrode 420 may extend along an eighth direction Y4 and intersect the fourth multi-channel active pattern 405. The fourth gate electrode 420 is formed on the first portion 405$a$ of the fourth multi-channel active pattern 405.

The fourth source/drain regions 440 are formed on the fourth multi-channel active pattern 405 on both sides of the fourth gate electrode 420. The fourth source/drain regions 440 may contact the field insulating layer 103.

FIG. 31 is a cross-sectional view of a semiconductor device 14 according to a fourteenth embodiment of the present invention. For simplicity, the fourteenth embodiment will be described, focusing mainly on differences with the thirteenth embodiment described above with reference to FIGS. 28 through 30.

Referring to FIG. 31, in the semiconductor device 14 according to the fourteenth embodiment of the present invention, a top surface 405$b$-1 of a second portion 405$b$ of a fourth multi-channel active pattern 405 is more recessed than a top surface 103$u$ of a field insulating layer 103.

That is, the top surface 405$b$-1 of the second portion 405$b$ of the fourth multi-channel active pattern 405 and the top surface 103$u$ of the field insulating layer 103 are discontinuous due to a step formed between them.

Part of a fourth source/drain region 440 formed on the top surface 405$b$-1 of the second portion 405$b$ of the fourth multi-channel active pattern 405 is surrounded by the field insulating layer 103.

FIG. 32 is a perspective view of a semiconductor device 15 according to a fifteenth embodiment of the present invention. FIG. 33 is a cross-sectional view taken along the lines C-C and D-D of FIG. 32. For simplicity, the fifteenth embodiment will be described, focusing mainly on differences with the thirteenth embodiment described above with reference to FIGS. 28 through 30.

More specifically, a third transistor 101 formed in a third region III of FIG. 32 may be one of the semiconductor devices 3 and 4 according to the third and fourth embodiments of the present invention. A case where the third transistor 101 formed in the third region III is the semiconductor device 4 according to the fourth embodiment of the present invention will be described below as an example.

Referring to FIGS. 32 and 33, in the semiconductor device 15 according to the fifteenth embodiment of the present invention, the third transistor 101 further includes first fin spacers 135, and a fourth transistor 401 further includes fourth fin spacers 435.

The fourth transistor 401 includes a fourth multi-channel active pattern 405, a fourth gate electrode 420, the fourth fin spacers 435, and fourth source/drain regions 440.

In the fourth transistor 401, a top surface 405b-1 of a second portion 405b of the fourth multi-channel active pattern 405 and a top surface 405a-1 of a first portion 405a of the fourth multi-channel active pattern 405 protrude further upward than a top surface 103u of a field insulating layer 103. That is, the first portion 405a of the fourth multi-channel active pattern 405 and the second portion 405b of the fourth multi-channel active pattern 405 protrude further upward than the field insulating layer 103.

The fourth fin spacers 435 are formed on sidewalls 405b-2 of the second portion 405b of the fourth multi-channel active pattern 405 which protrude further upward than the top surface 103u of the field insulating layer 103.

In the semiconductor device 15 according to the fifteenth embodiment of the present invention, a third height h3 of the fourth fin spacers 435 is substantially equal to a height from the top surface 103u of the field insulating layer 103 to the top surface 405b-1 of the second portion 405b of the fourth multi-channel active pattern 405. Therefore, the top surface 405b-1 of the second portion 405b of the fourth multi-channel active pattern 405 which protrudes further upward than the top surface 103u of the field insulating layer 103 does not protrude further upward than the fourth fin spacers 435.

The fourth fin spacers 435 and fourth gate spacers 430 are formed at the same level and are connected to each other.

The fourth source/drain regions 440 are formed on the fourth multi-channel active pattern 405 on both sides of the fourth gate electrode 420. The fourth source/drain regions 440 may contact the fourth fin spacers 435.

In FIG. 33, a bottommost part of each of the fourth source/drain regions 440 is formed along topmost parts of the fourth fin spacers 435. However, the present invention is not limited thereto. Each of the fourth source/drain regions 440 can also surround at least part of the fourth fin spacers 435.

FIG. 34 is a cross-sectional view of a semiconductor device 16 according to a sixteenth embodiment of the present invention. For simplicity, the sixteenth embodiment will be described, focusing mainly on differences with the fifteenth embodiment described above with reference to FIGS. 32 and 33.

Referring to FIG. 34, in the semiconductor device 16 according to the sixteenth embodiment of the present invention, a top surface 405b-1 of a second portion 405b of a fourth multi-channel active pattern 405 is more recessed than topmost parts 435t of fourth fin spacers 435.

Part of a fourth source/drain region 440 formed on the top surface 405b-1 of the second portion 405b of the fourth multi-channel active pattern 405 is surrounded by the fourth fin spacers 435.

FIGS. 35 and 36 are views of a semiconductor device 17 according to a seventeenth embodiment of the present invention. Specifically, FIG. 35 is a perspective view of the semiconductor device 17 according to the seventeenth embodiment of the present invention. FIG. 36 is a cross-sectional view taken along the lines C-C and D-D of FIG. 35.

Referring to FIGS. 35 and 36, the semiconductor device 17 according to the seventeenth embodiment of the present invention may include a substrate 100, a fifth multi-channel active pattern 505, a sixth multi-channel active pattern 605, a fifth gate electrode 520, a sixth gate electrode 620, fifth source/drain regions 540, sixth source/drain regions 640, fifth fin spacers 635, etc.

The substrate 100 may include a fifth region V and a sixth region VI. The fifth region V and the sixth region VI may be separated from each other or may be connected to each other. In addition, the fifth region V and the sixth region VI may include transistor regions of different types or the same type.

A fifth transistor 501 may be formed on the fifth region V of the substrate 100, and a sixth transistor 601 may be formed on the sixth region VI of the substrate 100.

The fifth transistor 501 includes the fifth multi-channel active pattern 505, the fifth gate electrode 520, and the fifth source/drain regions 540.

The fifth multi-channel active pattern 505 may be defined by a field insulating layer 103 and extend along a ninth direction X5. As in FIG. 3, the fifth multi-channel active pattern 505 includes a first portion 505a and a second portion 505b. The second portion 505b of the fifth multi-channel active pattern 505 is disposed on both sides of the first portion 505a of the fifth multi-channel active pattern 505 in the ninth direction X5.

A top surface 505b-1 of the second portion 505b of the fifth multi-channel active pattern 505 and a top surface 505a-1 of the first portion 505a of the fifth multi-channel active pattern 505 protrude further upward than a top surface 103u of a field insulating layer 103. That is, the first portion 505a of the fifth multi-channel active pattern 505 and the second portion 505b of the fifth multi-channel active pattern 505 protrude further upward than the field insulating layer 103. The second portion 505b of the fifth multi-channel active pattern 505 is more recessed than the first portion 505a of the fifth multi-channel active pattern 505.

The profile of sidewalls of the second portion 505b of the fifth multi-channel active pattern 505 is continuous. Specifically, the second portion 505b of the fifth multi-channel active pattern 505 includes a portion which contacts the field insulating layer 103 and a portion which protrudes further upward than the field insulating layer 103 without contacting the field insulating layer 103. Here, the profile of sidewalls of the second portion 505b of the fifth multi-channel active pattern 505 which contacts the field insulating layer 103 is continuous with the profile of sidewalls 505b-2 of the second portion 505b of the fifth multi-channel active pattern 505 which protrudes further upward than the field insulating layer 103.

The fifth gate electrode 520 may extend along a tenth direction Y5 and intersect the fifth multi-channel active pattern 505. The fifth gate electrode 520 may be formed on the fifth multi-channel active pattern 505, more specifically, on the first portion 505a of the fifth multi-channel active pattern 505. The fifth gate electrode 520 may include metal layers (522, 524). As illustrated in the drawings, the fifth gate electrode 520 may be a stack of two or more metal layers (522, 524).

The fifth source/drain regions 540 are formed on the fifth multi-channel active pattern 505 on both sides of the fifth gate electrode 520. In other words, each of the fifth source/drain regions 540 is formed on the second portion 505b of the fifth multi-channel active pattern 505.

Each of the fifth source/drain regions 540 is formed around the second portion 505b of the fifth multi-channel active pattern 505 which protrudes further upward than the top surface 103u of the field insulating layer 103. More specifically, each of the fifth source/drain regions 540 is formed on the top surface 505b-1 and the sidewalls 505b-2 of the second portion 505b of the fifth multi-channel active pattern 505 which protrudes further upward than the top surface 103u of the field insulating layer 103.

The whole of the second portion 505b of the fifth multi-channel active pattern 505 which protrudes further upward than the top surface 103u of the field insulating layer 103 contacts each of the fifth source/drain regions 540. In addition, the fifth source/drain regions 540 contact the field insulating layer 103.

In FIG. 36, bottommost parts of the fifth source/drain regions 540 do not extend along the top surface 103u of the field insulating layer 103. However, the present invention is not limited thereto. That is, as illustrated in FIG. 9, the fifth source/drain regions 540 can grow laterally along the top surface 103u of the field insulating layer 103 adjacent thereto.

The sixth transistor 601 includes the sixth multi-channel active pattern 605, the sixth gate electrode 620, the fifth fin spacers 635, and the sixth source/drain regions 640. Since the sixth multi-channel active pattern 605 and the sixth gate electrode 620 are substantially identical to the fifth multi-channel active pattern 505 and the fifth gate electrode 520 described above, a repetitive description thereof will be omitted.

The fifth fin spacers 635 are formed on part of sidewalls 605b-2 of a second portion 605b of the sixth multi-channel active pattern 605 which protrudes further upward than the top surface 103u of the field insulating layer 103. Therefore, part of the second portion 605b of the sixth multi-channel active pattern 605 protrudes further upward than the fifth fin spacers 635.

The fifth fin spacers 635 and sixth gate spacers 630 are formed at the same level and are connected to each other.

Each of the sixth source/drain regions 640 is formed on a top surface 605b-1 and the sidewalls 605b-2 of the second portion 605b of the sixth multi-channel active pattern 605 which protrudes further than the fifth fin spacers 635. Each of the sixth source/drain regions 640 is formed around the second portion 605b of the sixth multi-channel active pattern 605 which protrudes further than the fifth fin spacers 635 to contact the second portion 605b.

In the semiconductor device 17 according to the seventeenth embodiment of the present invention, a bottommost part 640b of each of the sixth source/drain regions 640 may be formed along topmost parts 635t of the fifth fin spacers 635. That is, each of the sixth source/drain regions 640 may not extend along outer side surfaces of the fifth fin spacers 635.

FIGS. 37 and 38 are views of a semiconductor device 18 according to an eighteenth embodiment of the present invention. For simplicity, the eighteenth embodiment will be described, focusing mainly on differences with the seventeenth embodiment described above with reference to FIGS. 35 and 36.

Referring to FIGS. 37 and 38, each of sixth source/drain regions 640 covers at least part of fifth fin spacers 635.

Each of the sixth source/drain regions 640 may extend along at least part of outer side surfaces of the fifth fin spacers 635. In addition, each of the sixth source/drain regions 640 may contact the fifth fin spacers 635 along the outer side surfaces of the fifth fin spacers 635.

In FIGS. 37 and 38, each of the sixth source/drain regions 640 partially cover the fifth fin spacers 635 and are separated from a field insulating layer 103 without contacting the field insulating layer 103. However, the present invention is not limited thereto.

That is, each of the sixth source/drain regions 640 can also entirely cover the fifth fin spacers 635 and contact the field insulating layer 103.

A method of fabricating a semiconductor device according to an embodiment of the present invention will now be described with reference to FIGS. 39 through 49. A semiconductor device formed through the processes of FIGS. 39 through 49 is one of the semiconductor devices 1 and 2 described above with reference to FIGS. 1 through 4, 8 and 9.

FIGS. 39 through 49 are views illustrating steps of a method of fabricating a semiconductor device according to an embodiment of the present invention.

Referring to FIG. 39, a pre-multi-channel active pattern 105p is formed on a substrate 100.

Specifically, a mask pattern 2103 is formed on the substrate 100 and then etched to form the pre-multi-channel active pattern 105p. The pre-multi-channel active pattern 105p may extend along a first direction X1. Trenches 106 are formed around the pre-multi-channel active pattern 105p. The mask pattern 2103 may be made of a material including at least one of a silicon oxide layer, a silicon nitride layer, and a silicon oxynitride layer.

Referring to FIG. 40, a field insulating layer 103 is formed to fill the trenches 106. The field insulating layer 103 may be made of a material including at least one of a silicon oxide layer, a silicon nitride layer, and a silicon oxynitride layer.

The pre-multi-channel active pattern 105p and the field insulating layer 103 may be made to lie in the same plane by a planarization process. In the planarization process, the mask pattern 2103 may be removed. However, the present invention is not limited thereto. That is, the mask pattern 2103 may be removed before the formation of the field insulating layer 103 or after a recess process which will be described with reference to FIG. 41.

Referring to FIG. 41, an upper part of the field insulating layer 103 is recessed to partially expose the pre-multi-channel active pattern 105p. The recess process may include a selective etching process. That is, the pre-multi-channel active pattern 105p is formed to protrude further upward than the field insulating layer 103. In other words, a lower part of the pre-multi-channel active pattern 105p may contact the field insulating layer 103 and may be surrounded by the field insulating layer 103. However, an upper part of the pre-multi-channel active pattern 105p may protrude further upward than the field insulating layer 103 without contacting the field insulating layer 103.

A portion of the pre-multi-channel active pattern 105p which protrudes further upward than the field insulating layer 103 may also be formed by an epitaxial process. Specifically, after the formation of the field insulating layer 103, a recess process may not be performed. Instead, a portion of the pre-multi-channel active pattern 105p may be formed by an epitaxial process that uses a top surface of the pre-multi-channel active pattern 105p exposed by the field insulating layer 103 as a seed.

In addition, a doping process for controlling a threshold voltage may be performed on the pre-multi-channel active pattern 105p. If the semiconductor device 1, 2, 3 or 4 is an NMOS fin transistor, impurities used may be boron (B). If the semiconductor device 1, 2, 3 or 4 is a PMOS fin transistor, the impurities used may be phosphorous (P) or arsenic (As).

Referring to FIG. 42, an etching process is performed using the mask pattern 2104, thereby forming a dummy gate pattern 125 which intersects the pre-multi-channel active pattern 105p and extends along a second direction Y1.

Accordingly, the dummy gate pattern 125 is formed on the pre-multi-channel active pattern 105p. The dummy gate pattern 125 may be formed on the field insulating layer 103 to partially overlap the pre-multi-channel active pattern 105p. The pre-multi-channel active pattern 105p includes a portion covered by the dummy gate pattern 125 and a portion exposed by the dummy gate pattern 125.

The dummy gate pattern 125 includes a dummy gate insulating layer 126 and a dummy gate electrode 127. For example, the dummy gate insulating layer 126 may be a silicon oxide layer, and the dummy gate electrode 127 may be polysilicon.

In the method of fabricating a semiconductor device according to the current embodiment, the dummy gate pattern 125 is formed to form a replacement gate electrode. However, the present invention is not limited thereto. That is, not a dummy gate pattern but a gate pattern can be formed using a material that will be used for a gate insulating layer and a gate electrode of a transistor.

Referring to FIG. 43, a spacer layer 131l is formed on the field insulating layer 103 to cover the dummy gate pattern 125 and the pre-multi-channel active pattern 105p.

The spacer layer 131l may be conformally formed on the dummy gate pattern 125 and the pre-multi-channel active pattern 105p. The spacer layer 131l is formed on the pre-multi-channel active pattern 105p which protrudes further upward than the field insulating layer 103.

The spacer layer 131l may include at least one of SiN, SiON, SiO$_2$, SiOCN, and combinations of the same. The spacer layer 131l may be formed by, e.g., chemical vapor deposition (CVD) or atomic layer deposition (ALD).

Referring to FIG. 44, a first multi-channel active pattern 105, first gate spacers 130, and pre-fin spacers 135p are formed by partially etching the spacer layer 131l and the pre-multi-channel active pattern 105p which protrudes further upward than the field insulating layer 103.

Specifically, a portion of the pre-multi-channel active pattern 105p which is not overlapped by the dummy gate pattern 125 is recessed by etching the pre-multi-channel active pattern 105p using the dummy gate pattern 125 as an etch mask. In the process of recessing the portion of the pre-multi-channel active pattern 105p which is not overlapped by the dummy gate pattern 125, the first gate spacers 130 are formed on sidewalls of the dummy gate electrode 127, and the pre-fin spacers 135p are formed on sidewalls of a second portion 105b of the first multi-channel active pattern 105 which protrudes further upward than a top surface 103u of the field insulating layer 103.

The first multi-channel active pattern 105 formed in the process of forming the first gate spacers 130 and the pre-fin spacers 135p is defined by the field insulating layer 103 and extends along the first direction X1. The first multi-channel active pattern 105 includes a first portion 105a and the second portion 105b. The dummy gate electrode 127 is formed on the first portion 105a of the first multi-channel active pattern 105.

The portion of the pre-multi-channel active pattern 105p which is not overlapped by the dummy gate electrode 127 is etched using the dummy gate electrode 127 as an etch mask. As a result, the second portion 105b of the first multi-channel active pattern 105 is formed. Therefore, the second portion 105b of the first multi-channel active pattern 105 is more recessed than the first portion 105a of the first multi-channel active pattern 105. That is, a top surface 105b-1 of the second portion 105b of the first multi-channel active pattern 105 is more recessed than a top surface of the first portion 105a of the first multi-channel active pattern 105.

In addition, the top surface 105b-1 of the second portion 105b of the first multi-channel active pattern 105 and the top surface of the first portion 105a of the first multi-channel active pattern 105 protrude further upward than the top surface 103u of the field insulating layer 103.

Referring to FIG. 45, the pre-fin spacers 135p are completely removed to completely expose sidewalls 105b-2 of the second portion 105b of the first multi-channel active pattern 105 which protrudes further upward than the top surface 103u of the field insulating layer 103.

Accordingly, the sidewalls 105b-2 and the top surface 105b-1 of the second portion 105b of the first multi-channel active pattern 105 which protrudes further upward than the top surface 103u of the field insulating layer 103 are exposed.

The removal of the pre-fin spacers 135p may be accomplished by, e.g., an etching process.

The pre-fin spacers 135p and the first gate spacers 130 may be made of the same material. Therefore, while the pre-fin spacers 135p are being removed, the first gate spacers 130 may be partially removed.

Referring to FIG. 46, each of first source/drain regions 140 is formed to contact the sidewalls 105b-2 and the top surface 105b-1 of the second portion 105b of the first multi-channel active pattern 105 which protrudes further upward than the top surface 103u of the field insulating layer 103.

In the method of fabricating a semiconductor device according to the current embodiment, the whole of the second portion 105b of the first multi-channel active pattern 105 which protrudes further upward than the top surface 103u of the field insulating layer 103 directly contacts each of the first source/drain regions 140.

The first source/drain regions 140 may be formed by an epitaxial process. The material that forms the first source/drain regions 140 may vary according to whether the semiconductor 1, 2, 3 or 4 according to an embodiment of the present invention is an n-type transistor or a p-type transistor. If necessary, impurities can be in-situ-doped during the epitaxial process.

Each of the first source/drain regions 140 may have at least one of a diamond shape, a circular shape, and a rectangular shape. In FIG. 46, the diamond shape (or a pentagonal shape or a hexagonal shape) is illustrated.

Referring to FIG. 47, an interlayer insulating film 150 is formed to cover the first source/drain regions 140, the first gate spacers 130, the dummy gate pattern 125, etc.

The interlayer insulating film 150 may include at least one of a low-k material, an oxide layer, a nitride layer, and an oxynitride layer. The low-k material may be formed of Flowable Oxide (FOX), Tonen SilaZen (TOSZ), Undoped Silica Glass (USG), Borosilica Glass (BSG), PhosphoSilaca (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or any combination of the same.

The interlayer insulating film 150 is planarized until a top surface of the dummy gate electrode 127 is exposed. As a result, the mask pattern 2104 may be removed, and the top surface of the dummy gate electrode 127 may be exposed.

Referring to FIG. 48, the dummy gate pattern 125, that is, the dummy gate insulating layer 126 and the dummy gate electrode 127 are removed.

The removal of the dummy gate insulating layer 126 and the dummy gate electrode 127 forms a trench 123 which partially exposes the field insulating layer 103 and the first portion 105a of the first multi-channel active pattern 105.

Referring to FIG. 49, a first gate insulating layer 110 and a first gate electrode 120 are formed in the trench 123.

The first gate insulating layer 110 may include a high-k material having a higher dielectric constant than a silicon oxide layer. The first gate insulating layer 110 may be formed substantially conformally along sidewalls and a bottom surface of the trench 123.

The first gate electrode 120 may include metal layers 122 and 124. The first gate electrode 120 may be formed by stacking two or more metal layers 122 and 124.

A method of fabricating a semiconductor device according to another embodiment of the present invention will now be described with reference to FIGS. 39 through 44 and 47 through 51. A semiconductor device fabricated through the processes of FIGS. 39 through 44 and 47 through 51 is one of the semiconductor devices 3 and 4 described above with reference to FIGS. 10 through 13.

FIGS. 50 and 51 are views illustrating steps of a method of fabricating a semiconductor device according to another embodiment of the present invention.

Referring to FIG. 50, pre-fin spacers 135p are partially removed, thereby partially exposing sidewalls 105b-2 of a second portion 105b of a first multi-channel active pattern 105 which protrudes further upward than a top surface 103u of a field insulating layer 103.

The partial removal of the pre-fin spacers 135p also results in the formation of first fin spacers 135 on part of the sidewalls 105b-2 of the second portion 105b of the first multi-channel active pattern 105 which protrudes further upward than the top surface 103u of the field insulating layer 103. Therefore, part of the second portion 105b of the first multi-channel active pattern 105 protrudes further upward than the first fin spacers 135.

Referring to FIG. 51, each of first source/drain regions 140 is formed to contact the sidewalls 105b-2 and the top surface 105b-1 of the second portion 105b of the first multi-channel active pattern 105 which protrudes further than the first fin spacers 135.

Each of the first source/drain regions 140 covers at least part of the first fin spacers 135. In addition, each of the first source/drain regions 140 is formed to contact the top surface 105b-1 and the sidewalls 105b-2 of the second portion 105b of the first multi-channel active pattern 105 which protrudes further upward than the first fin spacers 135.

Examples of an electronic system using the semiconductor devices 1 through 18 described above with reference to FIGS. 1 through 38 will now be described.

FIG. 52 is a block diagram of an electronic system 1100 including semiconductor devices according to embodiments of the present invention.

Referring to FIG. 52, the electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. In an example, the interface 1140 may include an antenna or a wired or wireless transceiver. Although not illustrated in the drawing, the electronic system 1100 may further include an operating memory for improving the operation of the controller 1110, such as a high-speed dynamic random access memory (DRAM) and/or static random access memory (SRAM). Any one of the semiconductor devices according to the above-described embodiments may be provided in the memory device 1130 or in the controller 1110 or the I/O device 1120.

The electronic system 1100 may be applied to nearly all types of electronic products capable of transmitting or receiving information in a wireless environment, such as a personal data assistant (PDA), a portable computer, a web tablet, a wireless phone, a mobile phone, a digital music player, a memory card, etc.

FIGS. 53 and 54 are diagrams illustrating examples of a semiconductor system to which semiconductor devices according to embodiments of the present invention can be applied. FIG. 53 illustrates a tablet personal computer (PC), and FIG. 54 illustrates a notebook computer. At least one of the semiconductor devices according to the above-described embodiments of the present invention, as set forth herein, may be used in the tablet PC, the notebook computer, etc. The semiconductor devices according to the embodiments of the present invention, as set forth herein, may also be applied to various integrated circuit (IC) devices other than those set forth herein.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

We claim:

1. A semiconductor device comprising:
   a substrate which comprises a first region and a second region;
   a first transistor which is formed in the first region; and
   a second transistor which is formed in the second region,
   wherein the first transistor comprises a first multi-channel active pattern which is defined by a field insulating layer, extends along a first direction, and includes a first portion and a second portion; a first gate electrode which extends along a second direction different from the first direction and is formed on the first portion; and a first source/drain region which is formed on both sides of the first gate electrode to contact a top surface and sidewalls of the second portion protruding further upward than a top surface of the field insulating layer and contacts the field insulating layer,
   wherein the second transistor comprises a second multi-channel active pattern which is defined by the field insulating layer, extends along a third direction, and includes a third portion and a fourth portion; a second gate electrode which extends along a fourth direction different from the third direction and is formed on the third portion; and a second source/drain region which is formed on both sides of the second gate electrode to contact a top surface and sidewalls of the fourth portion protruding further upward than the top surface of the field insulating layer, contacts the field insulating layer, and has a different conductivity type from that of the first source/drain region, and wherein the second portion is more recessed than the first portion, a top surface of the first portion and the top surface of the second portion protrude further upward than the top surface of the field insulating layer, the fourth portion is more recessed than the third portion, a top surface of the third portion and the top surface of the fourth portion protrude further upward than the top surface of the field insulating layer, a profile of the sidewalls of the second portion is continuous, and a profile of the sidewalls of the fourth portion is continuous.

2. The semiconductor device of claim 1, wherein a region in which the first source/drain region and the field insulating layer contact each other is the first region, and a region in which the second source/drain region and the field insulating layer contact each other is the second region, and wherein an area of the second region and an area of the first region are different from each other.

3. A semiconductor device comprising:
a substrate which comprises a first region and a second region;
a first transistor which is formed in the first region; and
a second transistor which is formed in the second region,
wherein the first transistor comprises a first multi-channel active pattern which is defined by a field insulating layer, extends along a first direction, and includes a first portion and a second portion; a first gate electrode which extends along a second direction different from the first direction and is formed on the first portion; first fin spacers which are formed on part of sidewalls of the second portion protruding further than a top surface of the field insulating layer; and a first source/drain region which is formed on both sides of the first gate electrode to contact a top surface and the sidewalls of the second portion protruding further than the first fin spacers,
wherein the second transistor comprises a second multi-channel active pattern which is defined by the field insulating layer, extends along a third direction, and comprises a third portion and a fourth portion; a second gate electrode which extends along a fourth direction different from the third direction and is formed on the third portion; second fin spacers which are formed on part of sidewalls of the fourth portion protruding further upward than the top surface of the field insulating layer; and a second source/drain region which is formed on both sides of the second gate electrode to contact a top surface and the sidewalls of the fourth portion protruding further upward than the top surface of the field insulating layer and has a different conductivity type from that of the first source/drain region, and
wherein the second portion is more recessed than the first portion, a top surface of the first portion and the top surface of the second portion protrude further upward than the top surface of the field insulating layer, the fourth portion is more recessed than the third portion, and a top surface of the third portion and the top surface of the fourth portion protrude further upward than the top surface of the field insulating layer.

4. The semiconductor device of claim 3, wherein a bottommost part of the first source/drain region is formed along topmost parts of the first fin spacers.

5. The semiconductor device of claim 3, wherein the second source/drain region partially covers the second fin spacers.

6. The semiconductor device of claim 3, wherein the second source/drain region contacts the field insulating layer.

7. A semiconductor device comprising:
a substrate which comprises a first region and a second region;
a first transistor which is formed in the first region; and
a second transistor which is formed in the second region,
wherein the first transistor comprises a first multi-channel active pattern which is defined by a field insulating layer, extends along a first direction, and includes a first portion and a second portion; a first gate electrode which extends along a second direction different from the first direction and is formed on the first portion; and a first source/drain region which is formed on both sides of the first gate electrode to contact a top surface and sidewalls of the second portion protruding further upward than a top surface of the field insulating layer and contacts the field insulating layer,
wherein the second transistor comprises a second multi-channel active pattern which is defined by the field insulating layer, extends along a third direction, and includes a third portion and a fourth portion; a second gate electrode which extends along a fourth direction different from the third direction and is formed on the third portion; and a second source/drain region which is formed on the fourth portion on both sides of the second gate electrode, and
wherein the second portion is more recessed than the first portion, a top surface of the first portion and the top surface of the second portion protrude further upward than the top surface of the field insulating layer, a top surface of the third portion protrudes further upward than the top surface of the field insulating layer, the top surface of the fourth portion does not protrude further upward than the top surface of the field insulating layer, and a profile of the sidewalls of the second portion is continuous.

8. The semiconductor device of claim 7, wherein the top surface of the field insulating layer and the top surface of the fourth portion lie in the same plane.

9. The semiconductor device of claim 7, wherein the top surface of the fourth portion is more recessed than the top surface of the field insulating layer.

* * * * *